United States Patent

Hirota

[11] Patent Number: 6,087,212
[45] Date of Patent: Jul. 11, 2000

[54] METHOD FOR FORMING A STORAGE NODE IN A SEMICONDUCTOR MEMORY

[75] Inventor: Toshiyuki Hirota, Tokyo, Japan

[73] Assignee: NEC Corporation, Tokyo, Japan

[21] Appl. No.: 08/865,976

[22] Filed: May 30, 1997

[30] Foreign Application Priority Data

May 30, 1996 [JP] Japan .................................. 8-136692

[51] Int. Cl.[7] ............................................. H01L 21/8234
[52] U.S. Cl. ........................ 438/238; 438/239; 438/250; 438/253; 438/393; 438/396; 438/648
[58] Field of Search .................................... 438/238, 239, 438/250, 253, 393, 396, 648

[56] References Cited

U.S. PATENT DOCUMENTS 5,953,609  9/1999  Koyama et al. ........................ 438/253

FOREIGN PATENT DOCUMENTS

| 62-58663 | 3/1987 | Japan . |
| 63-4670 | 1/1988 | Japan . |
| 1-137666 | 5/1989 | Japan . |
| 1-175756 | 7/1989 | Japan . |
| 4-254372 | 9/1992 | Japan . |

OTHER PUBLICATIONS

Japanese Office Action dated Jun. 2, 1998, with English language translation of Japanese Examiner's comments.

Primary Examiner—John F. Niebling
Assistant Examiner—Lynne A. Gurley
Attorney, Agent, or Firm—Whitham, Curtis & Whitham

[57] ABSTRACT

In a process for forming a storage node electrode in the COB structure DRAM, after a titanium nitride film is formed on a surface of a second interlayer insulator film, a node contact hole is formed to penetrate through the titanium nitride film and the underlying interlayer insulator films, and then, an $N^+$ polysilicon film is formed to cover the titanium nitride film and to fill the node contact hole. This $N^+$ polysilicon film is patterned by an anisotropic dry etching to form a silicon film pattern. An exposed titanium nitride film which is not covered by the silicon film pattern is converted into a titanium oxide. Thus, a storage node electrode is formed of the silicon film pattern and the titanium nitride film remaining under the silicon film pattern, with no notch being formed in the storage node electrode.

4 Claims, 17 Drawing Sheets

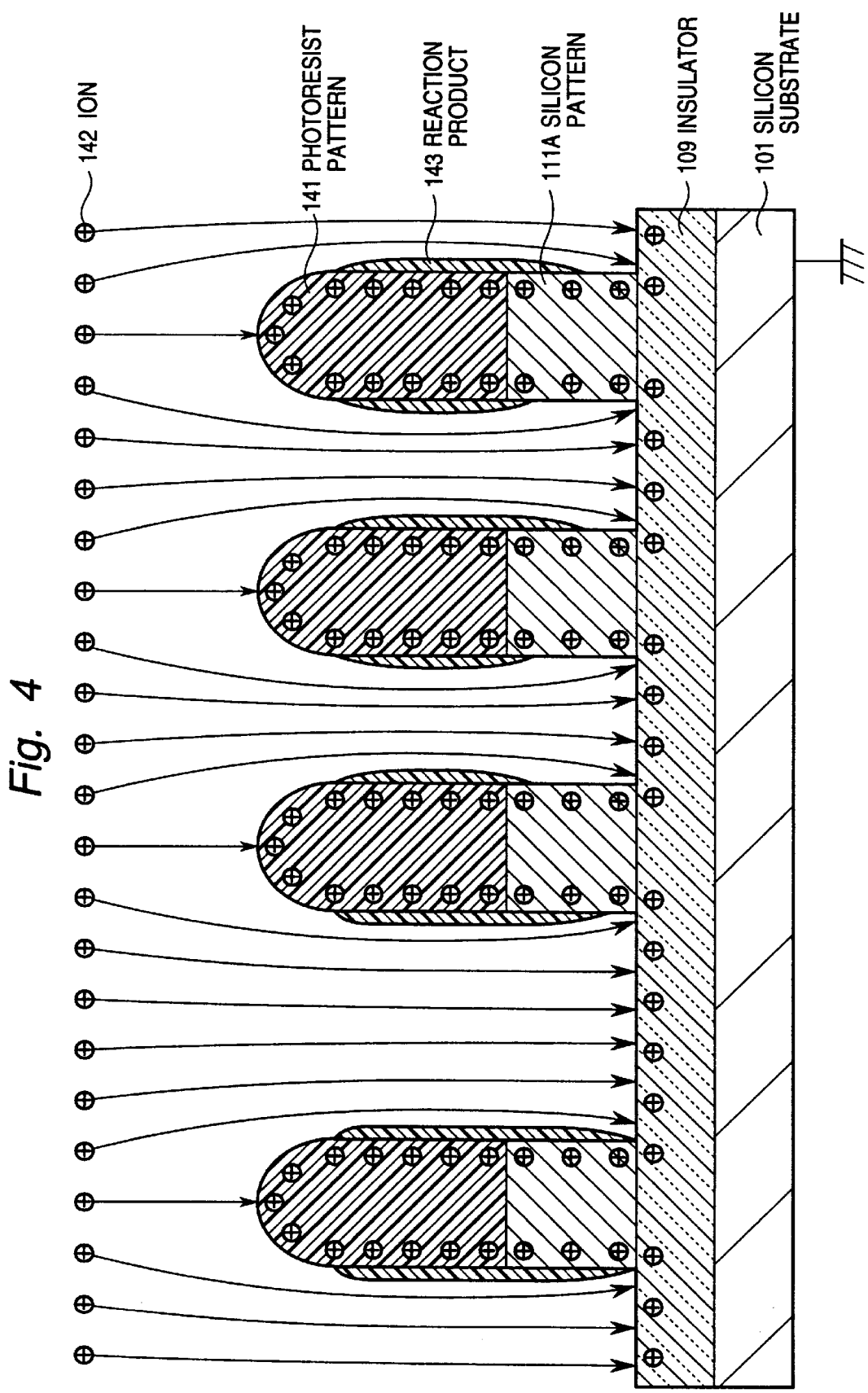

METHOD FOR FORMING A STORAGE NODE IN A SEMICONDUCTOR MEMORY

BACKGROUND OF THE INVENTION

1. Field of the Invention

The present invention relates to a method for manufacturing a semiconductor device, and more specifically to a method for forming a storage node in a semiconductor memory such as a DRAM (dynamic random access memory), having such a structure that a storage capacitor is formed over a bit line.

2. Description of Related Art

In a DRAM having each one memory cell constituted of one MOS transistor (metal-oxide-semiconductor field effect transistor) and one capacitor connected to the MOS transistor, with increase of an integration density, an occupying area of each memory cell in a plan view is decreasing. However, in order to ensure a property of resisting against a soft error caused by noise electric charges generated by α-ray, each DRAM memory cell requires the associated capacitor to have a capacitance of not smaller than a certain constant value. Therefore, how a necessary amount of storage capacitance is obtained in an occupying area limited in a plan view, has become a very important technical problem. Under a recent inclination for solving the above mentioned technical problem, a three-dimensional structure has been proposed to provide a stacked capacitor over a bit line, and to increase a height of a storage node electrode constituting a lower plate of the stacked capacitor, so that a side surface area of the storage node electrode becomes large.

The structure of this stacked storage capacitor formed over the bit line is called a COB structure ("capacitor over bit-line" structure).

Now, a prior art process for forming this COB structure DRAM memory cell will be described with reference to FIGS. 1A to 1E, 2A and 2B, and 3A and 3B. FIGS. 1A to 1E are diagrammatic sectional views, taken along the line 1—1 in FIGS. 2A and 2B, of a portion of a DRAM for illustrating the prior art process for forming the COB structure DRAM memory cell. FIG. 2A is a plan view of a DRAM illustrating a portion under the bit line, and FIG. 2B is a plan view of a DRAM illustrating a positional relation between a storage node electrode, a bit line, a node contact hole and a bit contact hole. FIGS. 3A and 3B are diagrammatic sectional views of a portion of a completed DRAM, taken along the line 1—1 and along the line 2—2 in FIGS. 2A and 2B, respectively.

First, as shown in FIG. 1A, on a P-type silicon substrate 301, a field oxide film 302 is formed to confine a plurality of device formation regions, in which a gate oxide film 303 is formed to cover a surface of the P-type silicon substrate 301. These device formation regions are of a T-shape in a plan view as can be seen from FIG. 2A, and regularly arranged on a principal surface of the P-type silicon substrate 301, as shown in FIG. 2A. A plurality of word lines 304 which also function as a gate electrode, are formed to extend over the gate oxide film 303 and the field oxide film 302, and thereafter, in a surface region of the P-type silicon substrate 301 within each device formation region, $N^+$ source/drain diffused regions 305A and 305B are formed in self alignment with the word line 304.

Then, as shown in FIG. 1B, a first interlayer insulator film 306 is formed to cover the whole surface. This interlayer insulator film 306 is formed of for example silicon oxide. A bit contact hole 307 is formed to penetrate through the interlayer insulator film 306 to reach the $N^+$ source/drain diffused region 305A, as shown in FIG. 1B and FIG. 2A.

Furthermore, as shown in FIG. 2A, a bit line 308 is formed to cover the interlayer insulator film 306 and to fill the bit contact hole 307, so that the bit line 308 is electrically connected through the bit contact hole 307 to the $N^+$ source/drain diffused region 305A.

Succeedingly, a second interlayer insulator film 309 is formed to cover the whole surface, as shown in FIG. 1C. This interlayer insulator film 309 is also formed of for example silicon oxide. In addition, a node contact hole 310 is formed to penetrate through the interlayer insulator films 309 and 30C to reach the $N^+$ source/drain diffused region 305B, as shown in FIG. 1C and FIG. 2A.

Thereafter, a non-doped polysilicon film (not shown) having a desired thickness is formed to cover the whole surface, by a LPCVD (low pressure chemical vapor deposition) process using monosilane ($SiH_4$) as a raw material under a growth temperature of 600° C. to 650° C. and a pressure of 13 Pa to 130 Pa. In addition, a thermal diffusion is conducted in a phosphorus oxychloride ($POCl_3$) atmosphere at a temperature of 800° C. to 900° C., so that the non-doped polysilicon film is converted to $N^+$ polysilicon film 331, as shown in FIG. 1D.

Succeedingly, the $N^+$ polysilicon film 331 is patterned by an anisotropic dry etching using a photoresist film pattern (not shown) as a mask, to form a storage node electrode 311 formed of $N^+$ polysilicon film, as shown in FIG. 1E and FIG. 2B.

Thereafter, the photoresist film pattern (not shown) is removed, and a capacitor dielectric film 312 and a cell plate electrode 313 are formed, as shown in FIG. 2B and FIGS. 3A and 3B. Thus, a COB structure DRAM memory cell is completed.

In the above mentioned prior art process for forming the COB structure DRAM memory cell, when the $N^+$ polysilicon film 331 is patterned by the anisotropic dry etching to form a storage node electrode 311, a problem occurs in connection with a shape. Namely, as shown in FIG. 1E and FIGS. 3A and 3B, a notch 351 occurs in the storage node electrode 311 in a location where a side surface of the storage node electrode 311 is in contact with the interlayer insulator film 309. This notch 351 weakens a mechanical strength of the storage node electrode 311, so that, for example, in a washing step conducted after the formation of the storage node electrode 311, the storage node electrode 311 is apt to be easily lost. This lowers a production yield of the DRAM.

SUMMARY OF THE INVENTION

Accordingly, it is an object of the present invention to provide an improved method for forming a storage node in a COB structure DRAM, which has overcome the above mentioned defect of the conventional one.

Another object of the present invention is to provide a method for forming, in a COB structure DRAM, a storage node having an elevated mechanical strength by minimizing or preventing generation of the notch as mentioned above.

The above and other objects of the present invention are achieved in accordance with the present invention by a method for manufacturing a semiconductor memory, comprising:

the step of selectively forming a field insulator film on a surface of a P-type silicon substrate to confine a device formation region, forming a gate insulator film on the surface of the silicon substrate within the device formation region, forming on the gate insulator film a word line functioning as a gate electrode, and forming within the device formation region at least one pair of $N^+$ source/drain regions in self alignment with the word line;

the step of forming a first interlayer insulator film to cover the surface of the silicon substrate, the field insulator film and the word line, forming a bit contact hole to penetrate through the first interlayer insulator film and to reach to one of the at least one pair of $N^+$ source/drain regions, and forming a bit line to extend over the first interlayer insulator film and to fill the bit contact hole so that the bit line is electrically connected to the one of the at least one pair of $N^+$ source/drain regions;

the step of forming a second interlayer insulator film to cover the surface of the first interlayer insulator and the bit line, forming a titanium nitride film to cover a surface of the second interlayer insulator, forming a node contact hole to penetrate through the titanium nitride film and the second and first interlayer insulator films and to reach to the other of the at least one pair of $N^+$ source/drain regions;

the step of forming an $N^+$ polysilicon film to cover a surface of the titanium nitride film and to fill the node contact hole, selectively forming a photoresist film pattern on the $N^+$ polysilicon film, and conducting an anisotropic dry etching to the $N^+$ polysilicon film using the photoresist film pattern as a mask, so as to form a silicon film pattern of the $N^+$ polysilicon film;

the step of converting an exposed titanium nitride film into an titanium oxide film, so that a storage node electrode is formed of the silicon film pattern and the titanium nitride film remaining under the silicon film pattern and is electrically connected to the other of the at least one pair of $N^+$ source/drain regions; and the step of forming a capacitor dielectric film to cover the storage node electrode, and forming a cell plate electrode to cover the capacitor dielectric film.

Preferably, the exposed titanium nitride film is converted into the titanium oxide film, by sputtering the exposed titanium nitride film with argon, and then, by oxidizing the exposed titanium nitride film by a low temperature oxidation in a dry oxygen atmosphere.

According to a second aspect of the present invention, there is provided a method for manufacturing a semiconductor memory, comprising:

the step of selectively forming a field insulator film on a surface of a P-type silicon substrate to confine a device formation region, forming a gate insulator film on the surface of the silicon substrate within the device formation region, forming on the gate insulator film a word line functioning as a gate electrode, and forming within the device formation region at least one pair of $N^+$ source/drain regions in self alignment with the word line;

the step of forming a first interlayer insulator film to cover the surface of the silicon substrate, the field insulator film and the word line, forming a bit contact hole to penetrate through the first interlayer insulator film and to reach to one of the at least one pair of $N^+$ source/drain regions, and forming a bit line to extend over the first interlayer insulator film and to fill the bit contact hole so that the bit line is electrically connected to the one of the at least one pair of $N^+$ source/drain regions;

the step of forming a second interlayer insulator film to cover the surface of the first interlayer insulator and the bit line, forming a node contact hole to penetrate through the second and first interlayer insulator films and to reach to the other of the at least one pair of $N^+$ source/drain regions;

the step of forming a non-doped silicon film to cover a surface of the second interlayer insulator film and to fill the node contact hole, selectively forming a photoresist film pattern on the non-doped silicon film, and conducting an anisotropic dry etching to the non-doped silicon film using the photoresist film pattern as a mask, so as to form a silicon film pattern of the non-doped silicon film;

the step of removing the photoresist film pattern, and converting the silicon film pattern of the non-doped silicon film into an $N^+$ silicon film, so that a storage node electrode is formed of the silicon film pattern of the $N^+$ silicon film and is electrically connected to the other of the at least one pair of $N^+$ source/drain regions; and the step of forming a capacitor dielectric film to cover the storage node electrode, and forming a cell plate electrode to cover the capacitor dielectric film.

According to a third aspect of the present invention, there is provided a method for manufacturing a semiconductor memory, comprising:

the step of selectively forming a field insulator film on a surface of a P-type silicon substrate to confine a device formation region, forming a gate insulator film on the surface of the silicon substrate within the device formation region, forming on the gate insulator film a word line functioning as a gate electrode, and forming within the device formation region at least one pair of $N^+$ source/drain regions in self alignment with the word line;

the step of forming a first interlayer insulator film to cover the surface of the silicon substrate, the field insulator film and the word line, forming a bit contact hole to penetrate through the first interlayer insulator film and to reach to one of the at least one pair of $N^+$ source/drain regions, and forming a bit line to extend over the first interlayer insulator film and to fill the bit contact hole so that the bit line is electrically connected to the one of the at least one pair of $N^+$ source/drain regions;

the step of forming a second interlayer insulator film to cover the surface of the first interlayer insulator and the bit line, forming a node contact hole to penetrate through the second and first interlayer insulator films and to reach to the other of the at least one pair of $N^+$ source/drain regions;

the step of forming a high-resistance N-type amorphous silicon film containing a high concentration of impurity, to cover a surface of the second interlayer insulator film and to fill the node contact hole, selectively forming a photoresist film pattern on the amorphous silicon film, and conducting an anisotropic dry etching to the amorphous silicon film using the photoresist film pattern as a mask, so as to form a silicon film pattern of the amorphous silicon film;

the step of removing the photoresist film pattern, and conducting a heat treatment to convert the silicon film pattern of the amorphous silicon film into an $N^+$ polysilicon film, so that a storage node electrode is formed of the silicon film pattern of the $N^+$ polysilicon film and is electrically connected to the other of the at least one pair of $N^+$ source/drain regions; and the step of forming a capacitor dielectric film to cover the storage node electrode, and forming a cell plate electrode to cover the capacitor dielectric film.

Preferably, the amorphous silicon film meets with at least one of a first condition that resistivity of the amorphous silicon film is not less than 10 Ωcm, a second condition that a film thickness of the amorphous silicon film is not greater than 0.4 μm, and a third condition that a spacing of the amorphous silicon film is not less than 0.6 μm.

The above and other objects, features and advantages of the present invention will be apparent from the following description of preferred embodiments of the invention with reference to the accompanying drawings.

BRIEF DESCRIPTION OF THE DRAWINGS

FIGS. 4, 5 and 6 are diagrammatic sectional views for illustrating why the notch is generated at a base edge portion of the storage node;

DESCRIPTION OF THE PREFERRED EMBODIMENTS

Figure 1A:
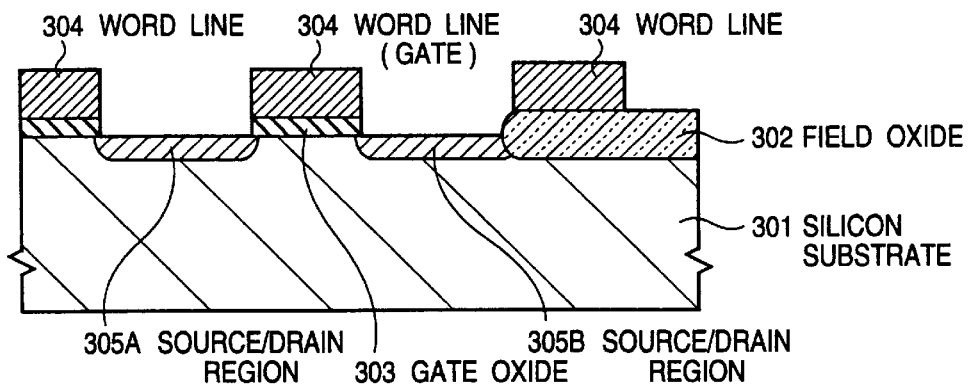
FIGS. 1A to 1E are diagrammatic sectional views, taken along the line 1—1 in FIGS. 2A and 2B, of a portion of a DRAM for illustrating the prior art process for forming the COB structure DRAM memory cell.
Figure 1B:
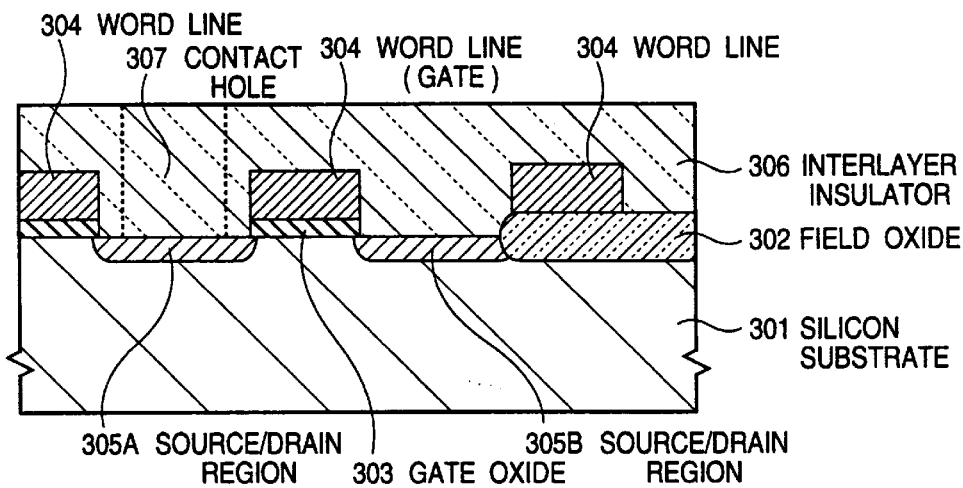
Figure 1C:
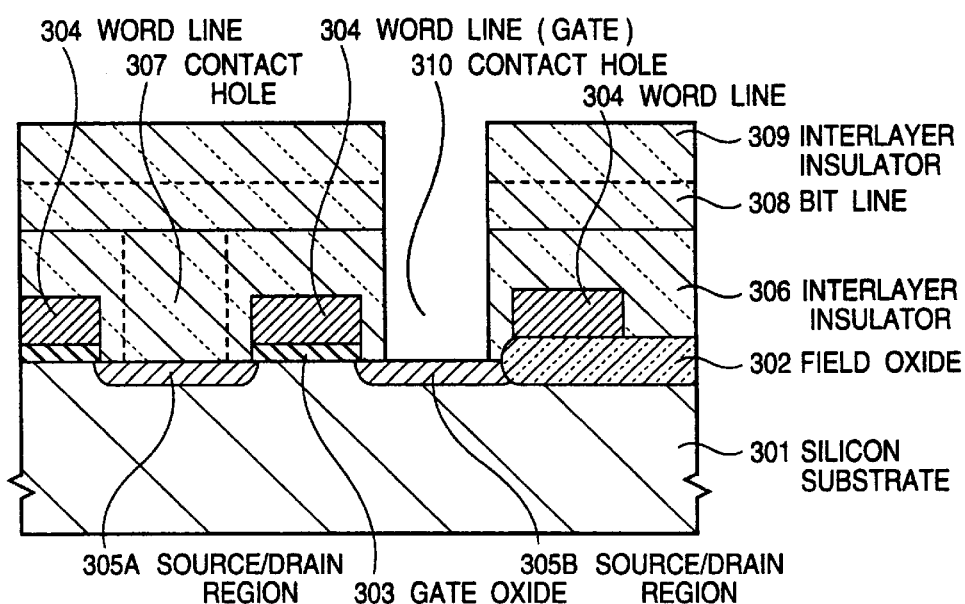
Figure 1D:
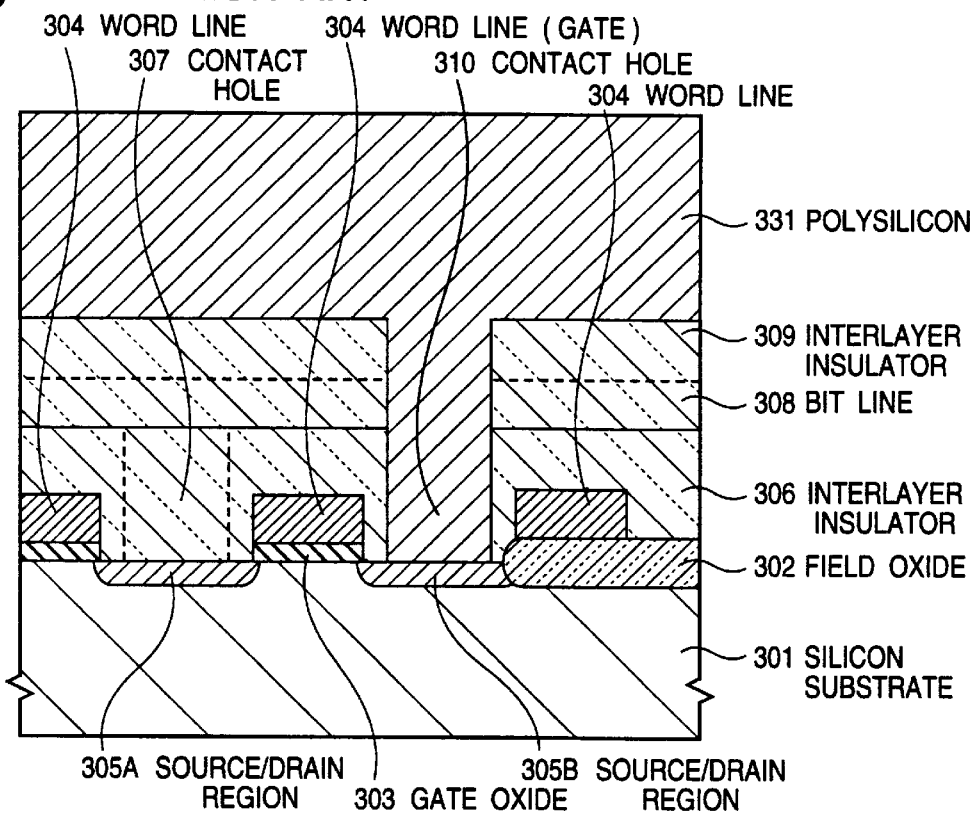
Figure 1E:
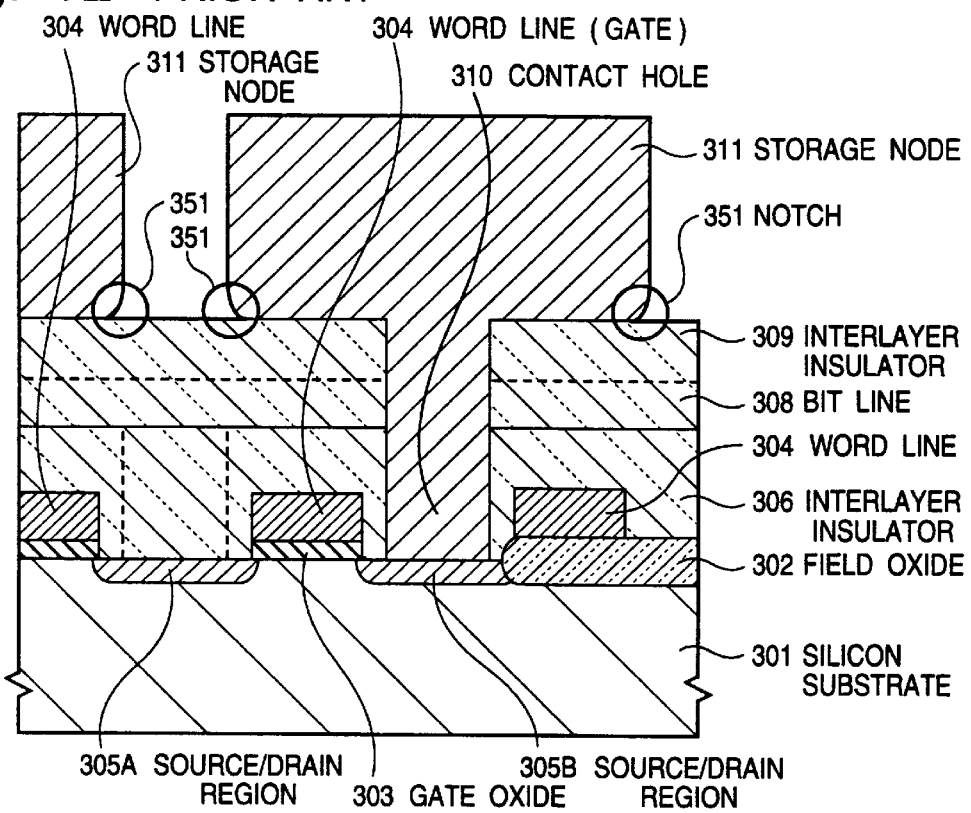
Figure 2A:
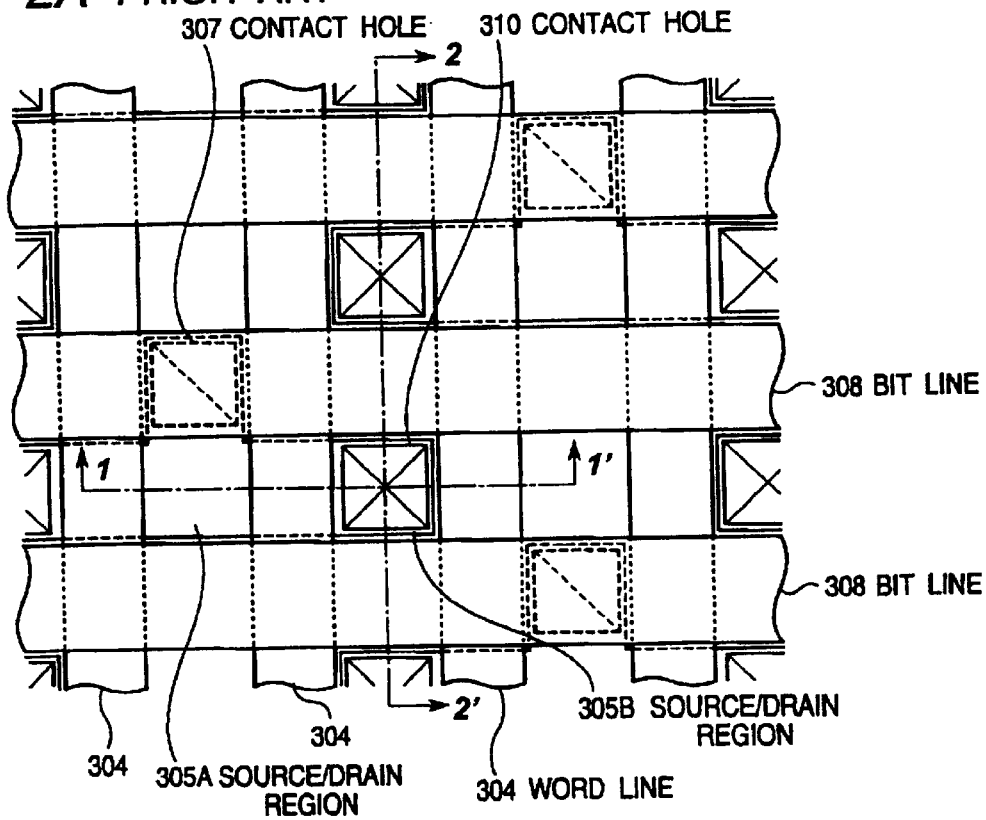
FIGS. 2A and 2B are plan views of a DRAM illustrating a portion under the bit line, and a positional relation among a storage node electrode, a bit line, a node contact hole and a bit contact hole, respectively.
Figure 2B:
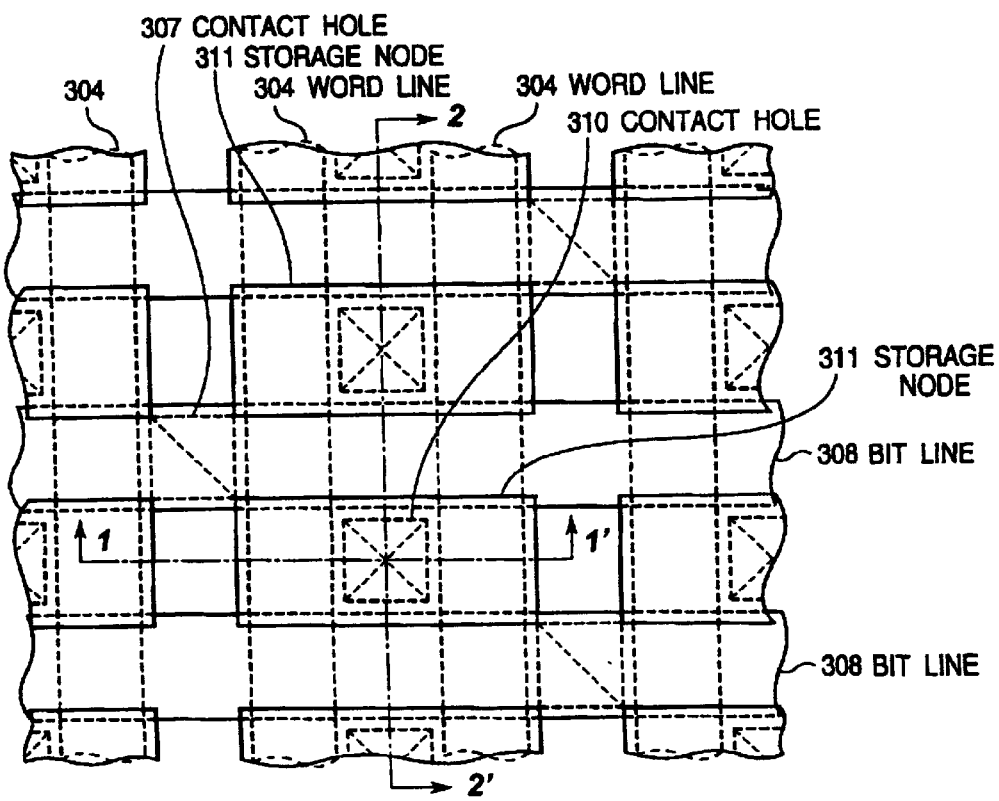
Figure 3A:
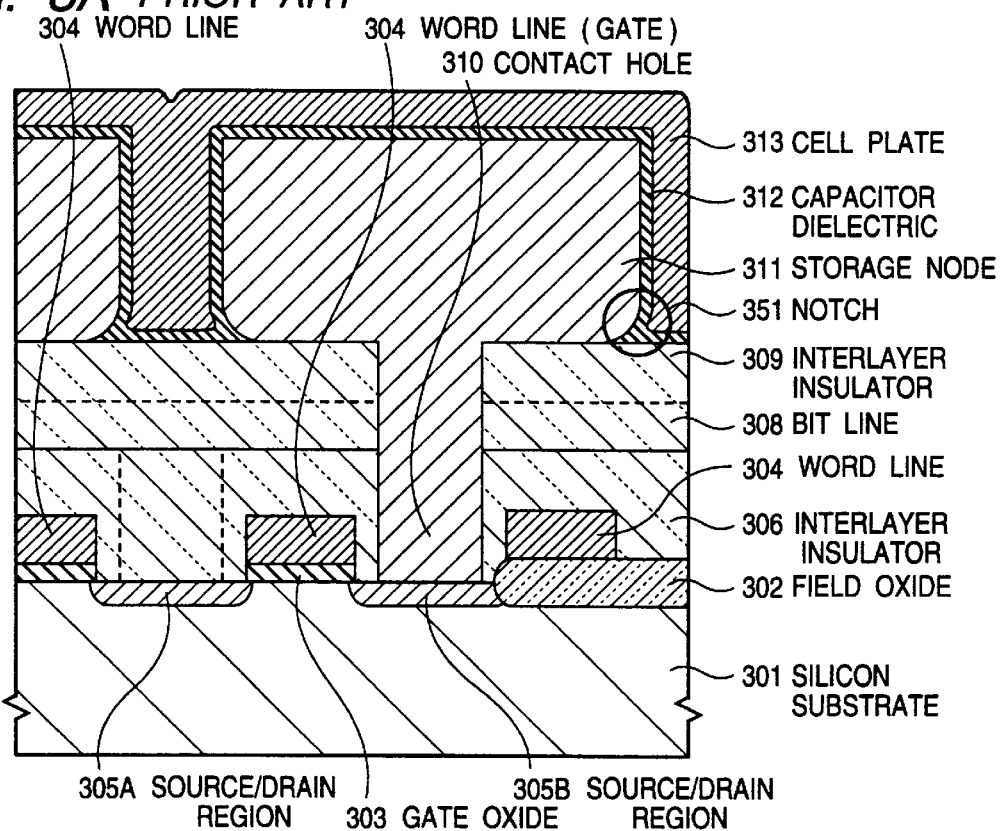
FIGS. 3A and 3B are diagrammatic sectional views of a portion of a completed DRAM, taken along the line 1—1 and along the line 2—2 in FIGS. 2A and 2B, respectively.
Figure 3B:
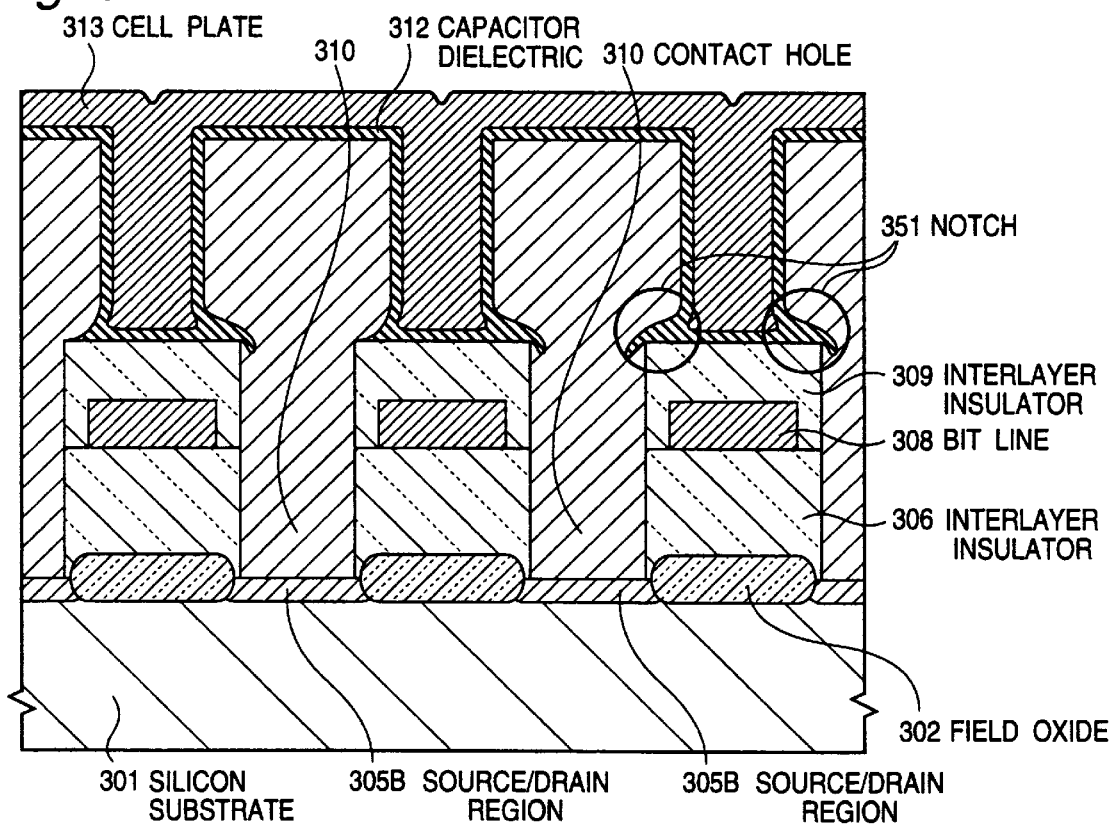

Before explanation will be made on embodiments of the process in accordance with the present invention for forming the COB structure DRAM memory cell, the inventor's study about a cause of the generation of the notch in the process of forming the storage node electrode will be explained with reference to FIGS. 4, 5 and 6.

FIG. 4 shows a first experimental example in which a silicon film pattern 111A formed on an insulator film 109 covering a surface of a silicon substrate 101, is composed of an N+ polysilicon film, but the silicon film pattern 111A is not electrically connected to the silicon substrate 101 (namely, no contact hole is formed to penetrate through the insulator film).

First, the insulator film 109 is formed to cover the surface of the silicon substrate 101, and then, the N+ polysilicon film is formed to cover insulator film 109 with forming no contact hole penetrating through the insulator film 109. A photoresist film pattern 141 is formed on the N+ polysilicon film, and the N+ polysilicon film is patterned by an anisotropic dry etching using the photoresist film pattern 141 as a mask, while maintaining the silicon substrate 101 in a grounded condition. Thus, the silicon film pattern 111A is formed. Here, Reference Numeral 142 designates ions.

In this process of this anisotropic dry etching, a portion of a side surface of the silicon film pattern 111A and a side surface of the photoresist film pattern 141 are covered with a reaction product 143. A lower portion of the side surface of the silicon film pattern 111A is hardly covered with the reaction product, in comparison with an upper portion of the side surface of the silicon film pattern 111A. In this case, no notch is generated in the silicon film pattern 111A at a location where the silicon film pattern 111A is in contact with the insulator film 109.

Figure 5:
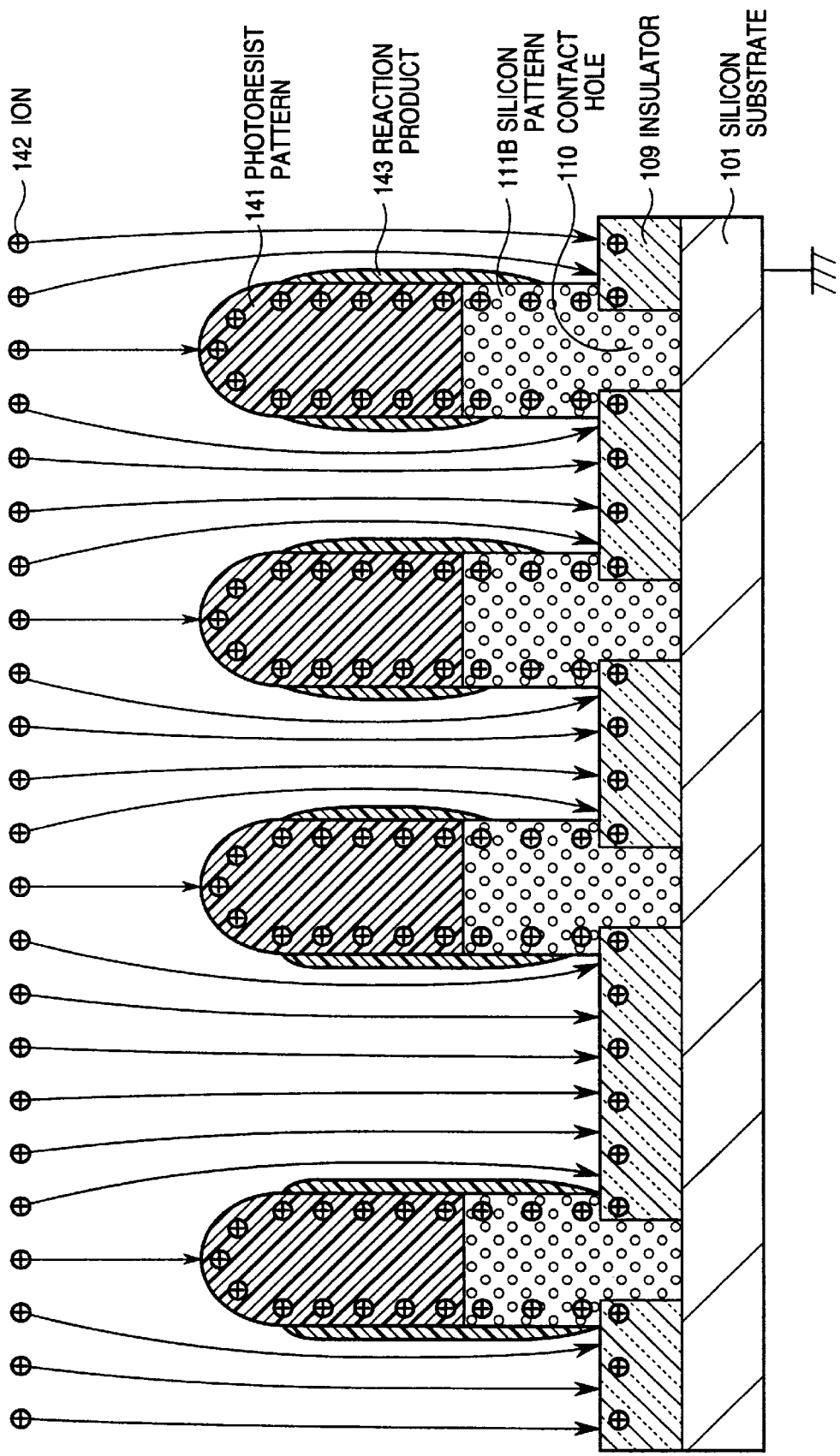

FIG. 5 shows a second experimental example in which a silicon film pattern 111B formed on an insulator film 109 covering a surface of a silicon substrate 101, is composed of a non-doped polysilicon film, and the silicon film pattern 111B is mechanically connected to the silicon substrate 101 through a contact hole 110 which is formed to penetrate through the insulator film 109, but the silicon film pattern 111B is not electrically connected to the silicon substrate 101, because the non-doped polysilicon film is not conductive. In FIG. 5, elements corresponding to those shown in FIG. 4 are given the same Reference Numerals.

First, the insulator film 109 is formed to cover the surface of the silicon substrate 101, and then, contact holes 110 are formed to penetrate through the insulator film 109 and to reach the silicon substrate 101. Furthermore, a non-doped polysilicon film is formed to cover insulator film 109 and to fill the contact holes 110. A photoresist film pattern 141 is formed on the non-doped polysilicon film, and the non-doped polysilicon film is patterned by an anisotropic dry etching using the photoresist film pattern 141 as a mask, while maintaining the silicon substrate 101 in a grounded condition. Thus, the silicon film pattern 111B is formed. In this process of this anisotropic dry etching, a portion of a side surface of the silicon film pattern 111B and a side surface of the photoresist film pattern 141 are covered with a reaction product 143.

Also in this case, no notch is generated in the silicon film pattern 111B at a location where the silicon film pattern 111B is in contact with the insulator film 109.

Figure 6:
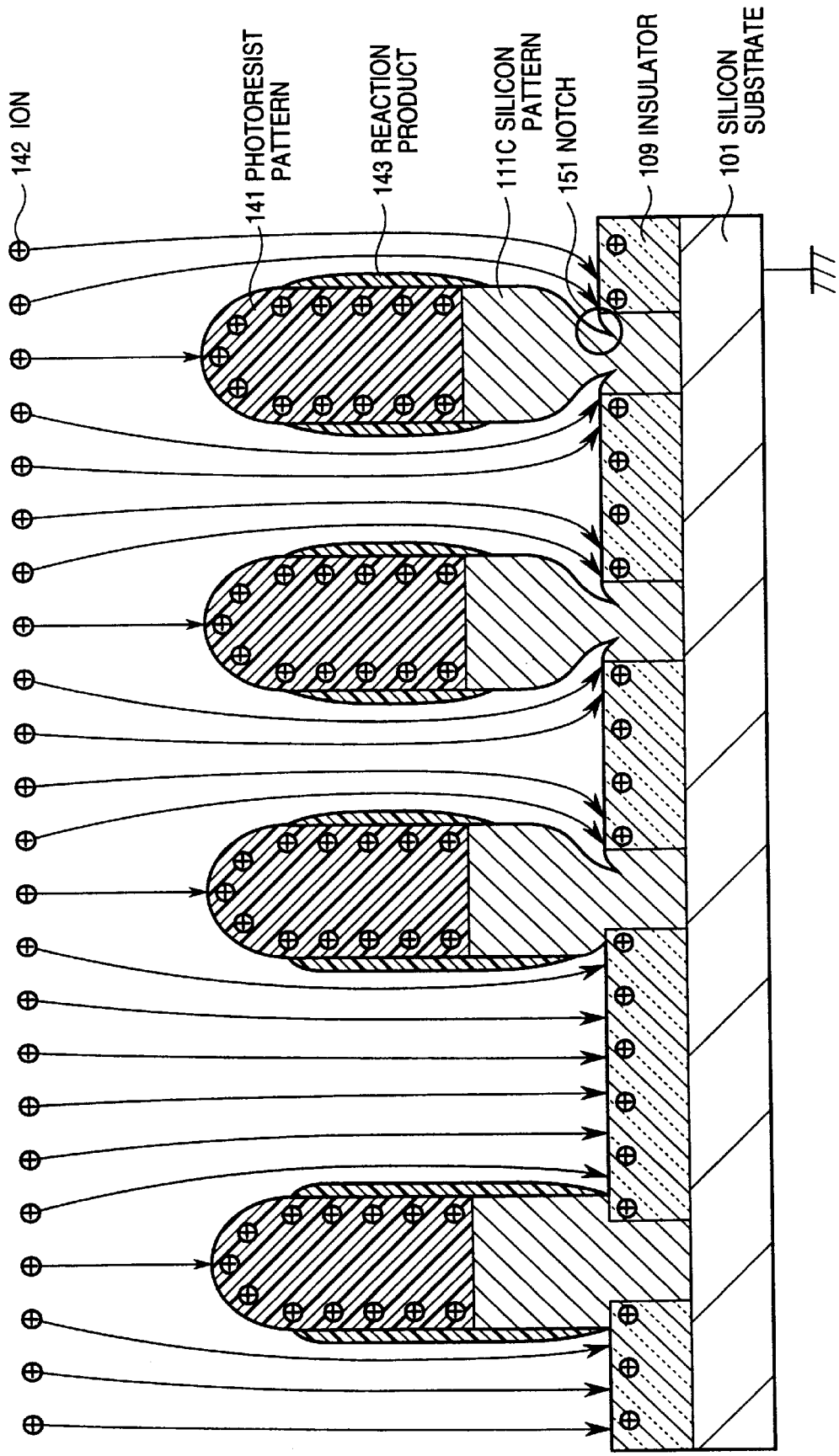

FIG. 6 shows a third experimental example in which a silicon film pattern 111B formed on an insulator film 109 covering a surface of a silicon substrate 101, is composed of an $N^+$ polysilicon film, and the silicon film pattern 111C is electrically connected to the silicon substrate 101 through a contact hole 110 which is formed to penetrate through the insulator film 109. In FIG. 6, elements corresponding to those shown in FIGS. 4 and 5 are given the same Reference Numerals.

In this third experimental example, notches 151 are generated in the silicon film pattern 111C at a location where the silicon film pattern 111C is in contact with the insulator film 109, as mentioned hereinbefore in connection with the prior art.

Comparing the above mentioned result of the experimental examples, the inventor concluded as follows: Because of ions 142 for the anisotropic dry etching, respective surfaces of the silicon film patterns 111A, 111B and 111C, the photoresist film pattern 141 and the reaction product 143 are charged with positive electric charges. However, in the first and second experimental examples, no current path for discharging these electric charges exists. Therefore, even at a final stage of formation of the silicon film pattern 111A or 111B, a current attributable to the ions 142 and/or a current attributable to the charged positive electric charges is not locally concentrated in a location where the silicon film pattern 111A or 111B is in contact with the insulator film 109 (FIGS. 4 and 5). Thus, generation of the notch is avoided. In the third experimental example, on the other hand, a current path exists. Therefore, at a final stage of formation of the silicon film pattern 111C, since the side surface of the silicon film pattern 111C excluding a lower portion where the silicon film pattern 111C is in contact with the insulator film 109, is covered with the reaction product 143 (not conductive), a current attributable to the ions and/or a current attributable to the charged positive charges is locally concentrated in a location where the silicon film pattern 111C is in contact with the insulator film 109 (FIG. 6). Accordingly, the notches are generated.

On the basis of the result of the experimental examples mentioned above, in order to avoid generation of the notches, it is preferred to remove the current path for etching ions in the anisotropic dry etching, or to prevent the current path from being locally concentrated in a local portion although the current path exists.

Figure 7A:
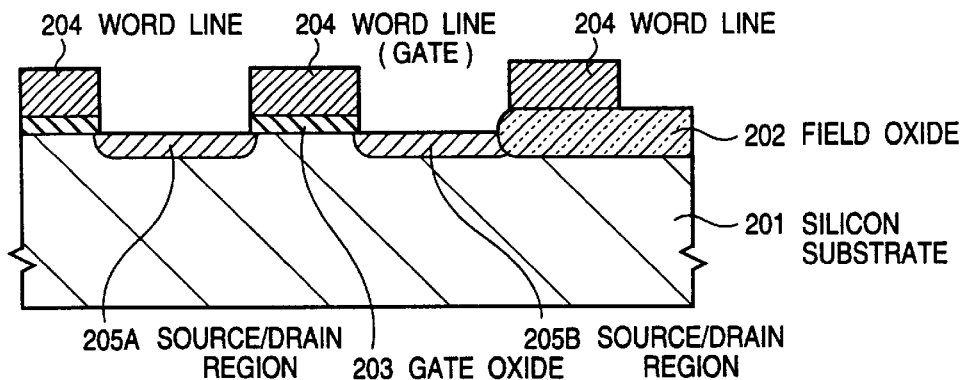
FIGS. 7A to 7E are diagrammatic sectional views, taken along the line 7—7 in FIGS. 8A and 8B, of a portion of a DRAM for illustrating a first embodiment of the process in accordance with the present invention for forming the COB structure DRAM memory cell.
Figure 8A:
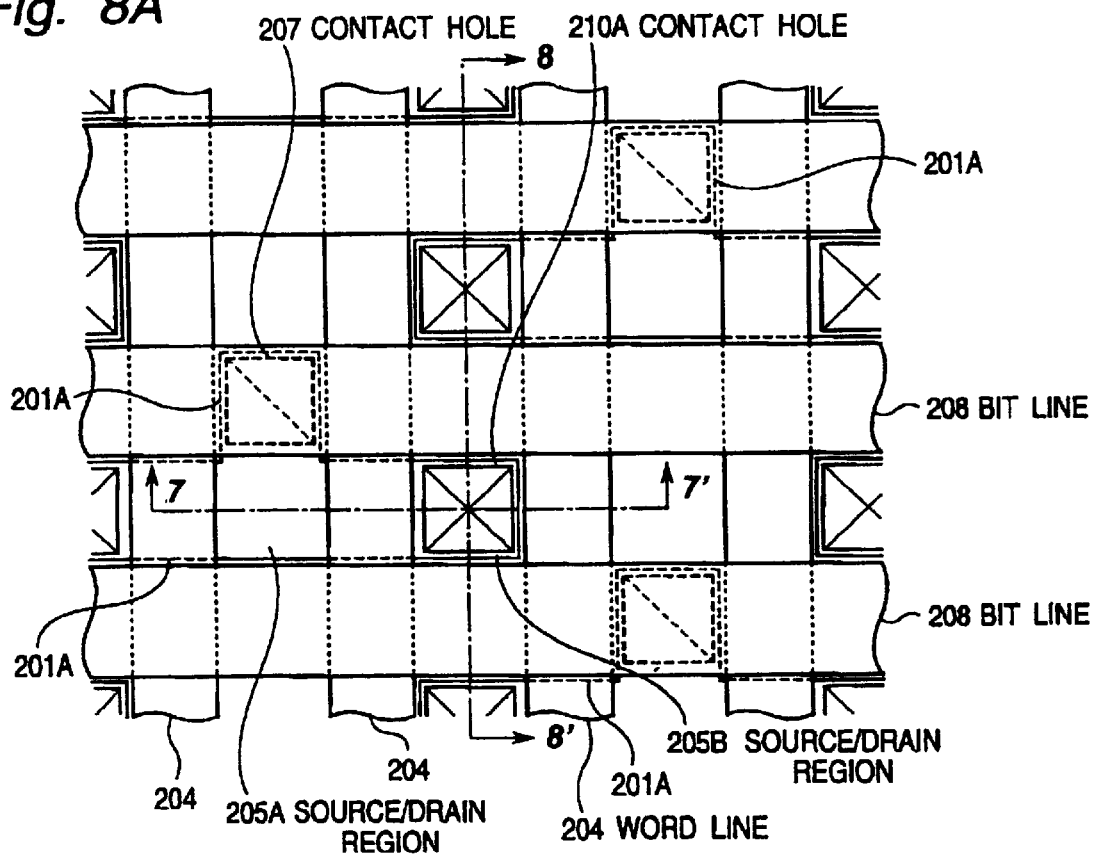
FIGS. 8A and 8B are plan views of a DRAM illustrating a portion under the bit line, and a positional relation among a storage node electrode, a bit line, a node contact hole and a bit contact hole, respectively, in the DRAM formed by the first embodiment of the process in accordance with the present invention.
Figure 8B:
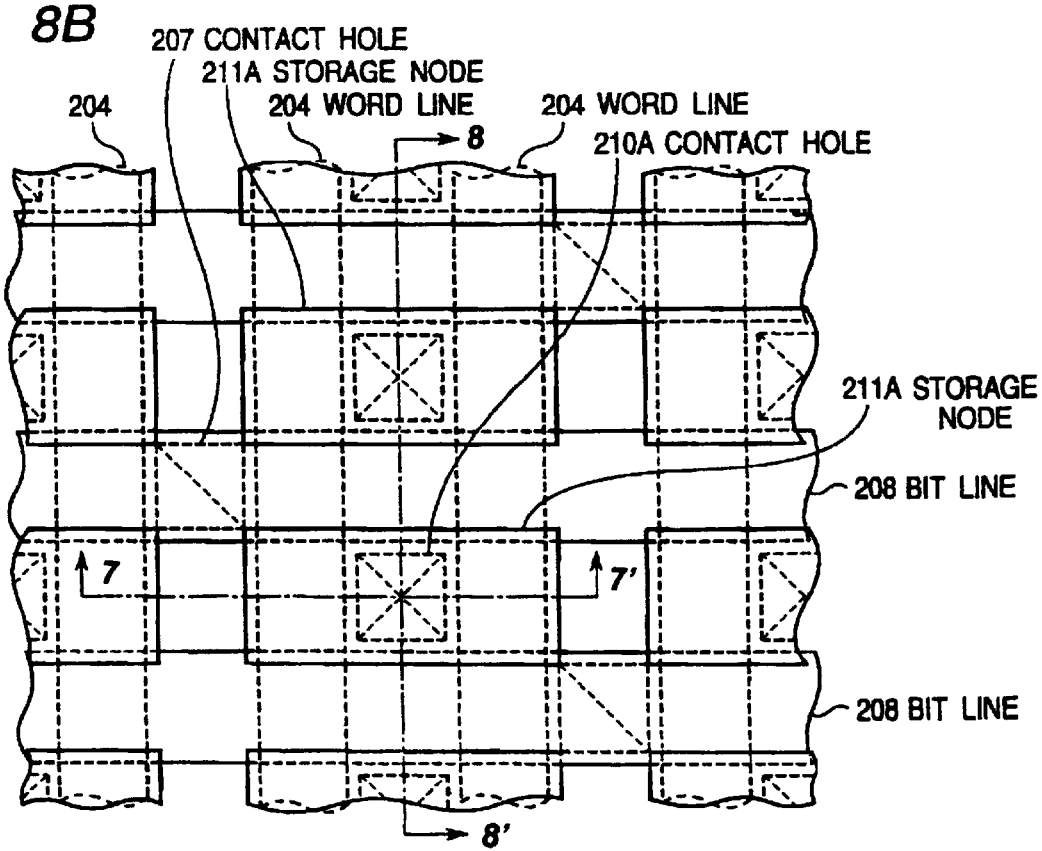
Figure 9A:
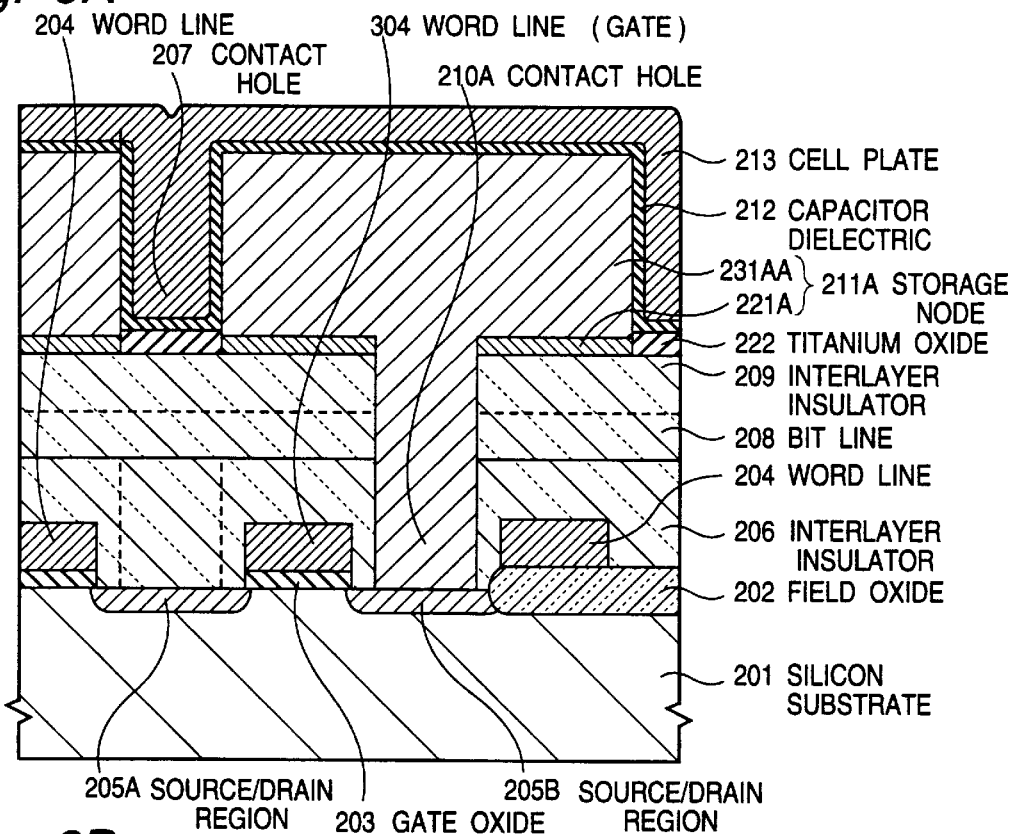
FIGS. 9A and 9B are diagrammatic sectional views, taken along the line 7—7 and along the line 8—8 in FIGS. 8A and 8B, respectively, of a portion of a completed DRAM formed by the first embodiment of the process in accordance with the present invention.
Figure 9B:
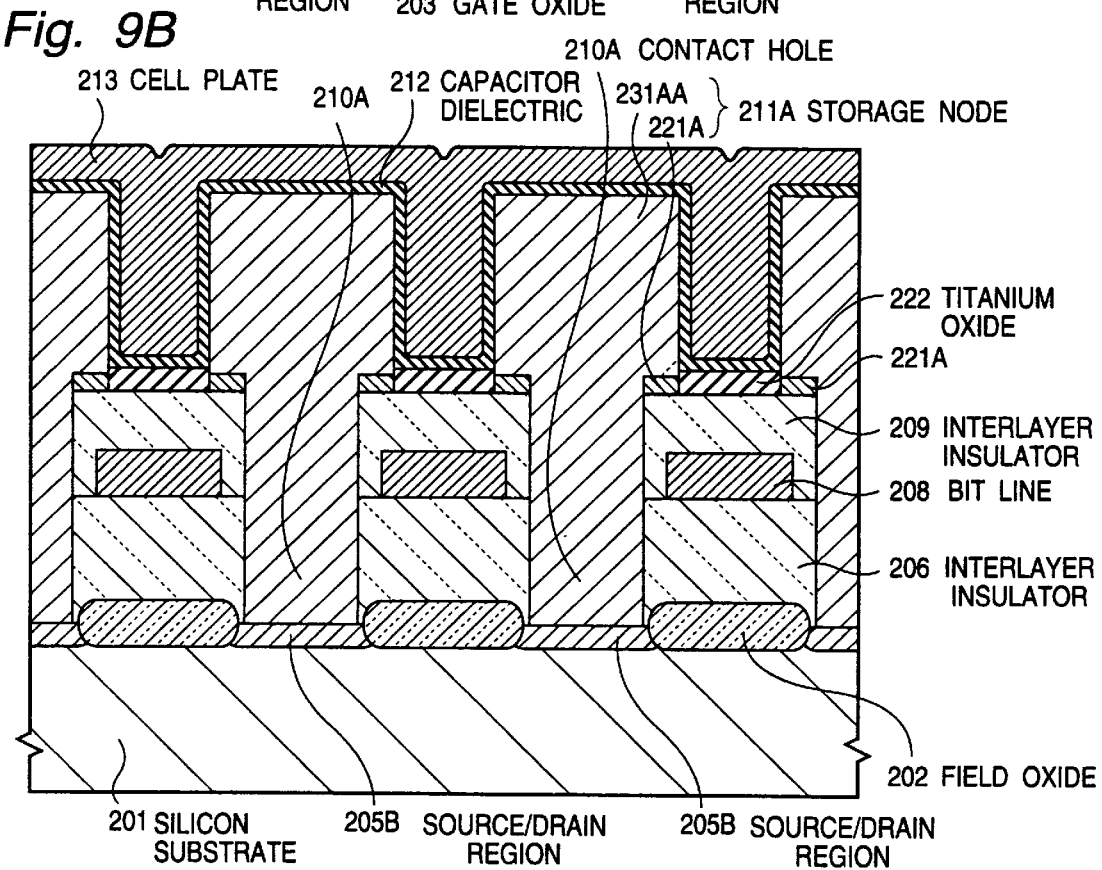

Now, a first embodiment of the process in accordance with the present invention for forming this COB structure DRAM memory cell by avoiding a local concentration of the current path, will be described with reference to FIGS. 7A to 7E, 8A and 8B, and 9A and 9B. FIGS. 7A to 7E are diagrammatic sectional views, taken along the line 7—7 in FIGS. 8A and 9B, of a portion of a DRAM for illustrating the first embodiment of the process in accordance with the present invention for forming the COB structure DRAM memory cell. FIGS. 8A and 8B are plan views of a DRAM illustrating a portion under the bit line, and a positional relation among a storage node electrode, a bit line, a node contact hole and a bit contact hole, respectively, in the DRAM formed by the first embodiment of the process in accordance with the present invention. FIGS. 9A and 9B are diagrammatic sectional views, taken along the line 7—7 and along the line 8—8 in FIGS. 8A and 8B, respectively, of a portion of a completed DRAM formed by the first embodiment of the process in accordance with the present invention;

First, as shown in FIG. 7A, on a principal surface of a P-type silicon substrate 201, a field oxide film 202 having a thickness on the order of 300 nm is formed by a selection oxidation, to confine a plurality of device formation regions 201A as shown in FIG. 8A. A gate oxide film 203 having a thickness of about 8 nm is formed by a thermal oxidation to cover a surface of the P-type silicon substrate 201 in each device formation regions 201A. The device formation regions 201A are of a T-shape in a plan view as seen from FIG. 8A, and regularly arranged on a principal surface of the P-type silicon substrate 201, as shown in FIG. 8A. A plurality of word lines 204 which also function as a gate electrode, are formed to extend over the gate oxide film 203 and the field oxide film 202, and thereafter, in a surface region within each device formation region 201A, at least a pair of $N^+$ source/drain diffused regions 205A and 205B are formed in self alignment with the word line 204. Specifically, within each T-shaped device formation region 201A, there are formed one common $N^+$ source/drain diffused region 205A and two $N^+$ source/drain diffused regions 205B which are formed at opposite sides of the common $N^+$ source/drain diffused region 205A, respectively, so that in each device formation region 201A, there are formed two MOSFETs each of which is constituted to include the common $N^+$ source/drain diffused region 205A and one of the two $N^+$ source/drain diffused regions 205B.

Here, the word line 204 is formed of a tungsten polycide film having the thickness on the order of 200 nm, and has a line width (namely, gate length) on the order of 0.35 $\mu$m. The $N^+$ source/drain diffused regions 205A and 205B has a junction depth on the order of 0.1 $\mu$m, and a width (namely, gate width) on the order of 0.45 $\mu$m.

Figure 7B:
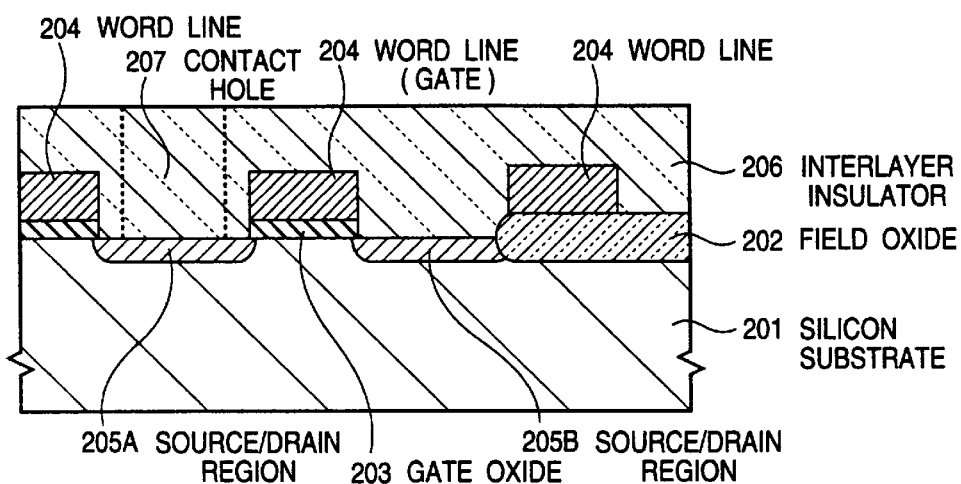

Then, as shown in FIG. 7B, a first interlayer insulator film 206 is formed to cover the whole surface. This interlayer insulator film 206 has a film thickness of 500 nm directly above the $N^+$ source/drain diffused regions 205A and 205B. The interlayer insulator film 206 is formed of for example an insulator film containing a silicon oxide, and at least a portion directly covering the word lines 204 and the $N^+$ source/drain diffused regions 205A and 205B, is constituted of a silicon oxide film. A surface of the interlayer insulator film 206 is preferably planarized by a CMP (chemical mechanical polishing) process or another. A bit contact hole 207 is formed to penetrate through the interlayer insulator film 206 to reach the $N^+$ source/drain diffused region 205A, as shown in FIG. 7B and FIG. 8A. A size (or diameter) of this bit contact hole 207 is on the order of 0.35 $\mu$m.

Furthermore, as shown in FIG. 8A, a bit line 208 is formed to cover the interlayer insulator film 206 and to fill the bit contact hole 207, so that the bit line 208 is electrically connected through the bit contact hole 207 to the $N^+$ source/drain diffused region 205A. This bit line 208 is formed of a tungsten silicide film having the thickness on the order of 200 nm, and has a line width on the order of 0.45 $\mu$m.

Figure 7C:
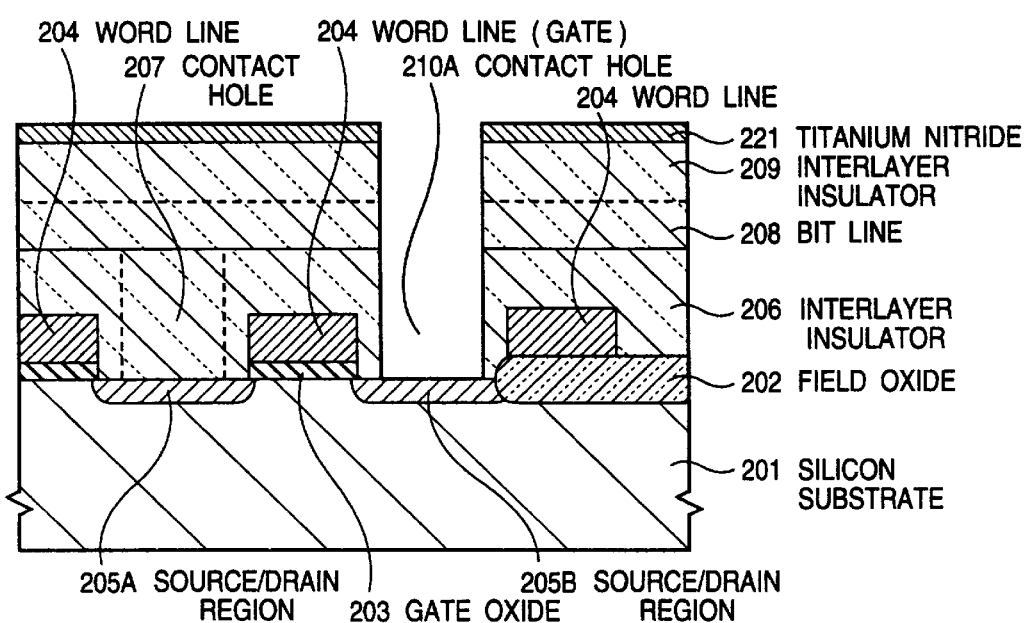

Succeedingly, a second interlayer insulator film 209 is formed to cover the whole surface, as shown in FIG. 7C. This interlayer insulator film 209 is also formed of for example silicon oxide, and preferably has a planarized surface. The interlayer insulator film 209 has a film thickness of 500 nm at a portion directly covering the first interlayer insulator film 206. Furthermore, a titanium nitride film 221 having the thickness on the order of 50 nm is formed, by for example a reactive sputtering, to cover a surface of the interlayer insulator film 209.

In addition, a node contact hole 210A is formed to penetrate through the titanium nitride film 221 and the interlayer insulator films 209 and 206 to reach the $N^+$ source/drain diffused region 205B, as shown in FIG. 7C and FIGS. 8A and 8B. A size (or diameter) of this node contact hole 210A is on the order of 0.35 μm.

Figure 7D:
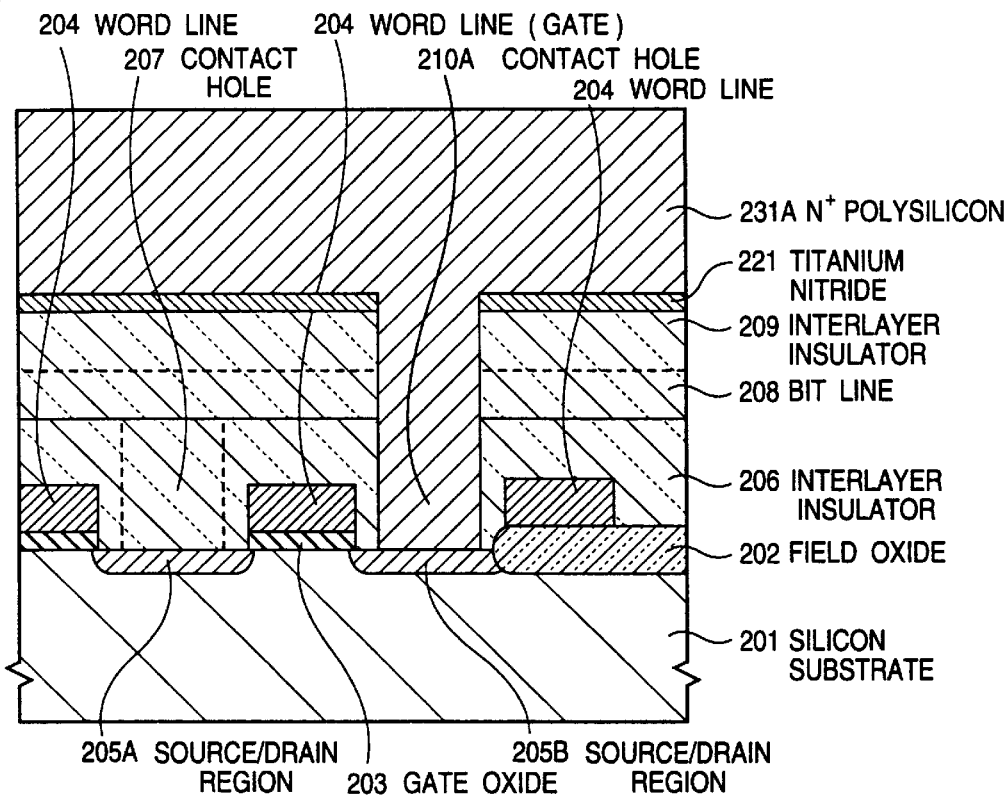

Thereafter, an N⁺ polysilicon film 231A having the film thickness on the order of 0.6 μm is formed to cover the whole surface, by a LPCVD process under a film deposition temperature of 650° C., as shown in FIG. 7D. Alternatively, a non-doped polysilicon film (not shown) can be formed, and then, the non-doped polysilicon film can be converted to an N⁺ polysilicon film by a thermal diffusion or an ion implantation.

Figure 7E:
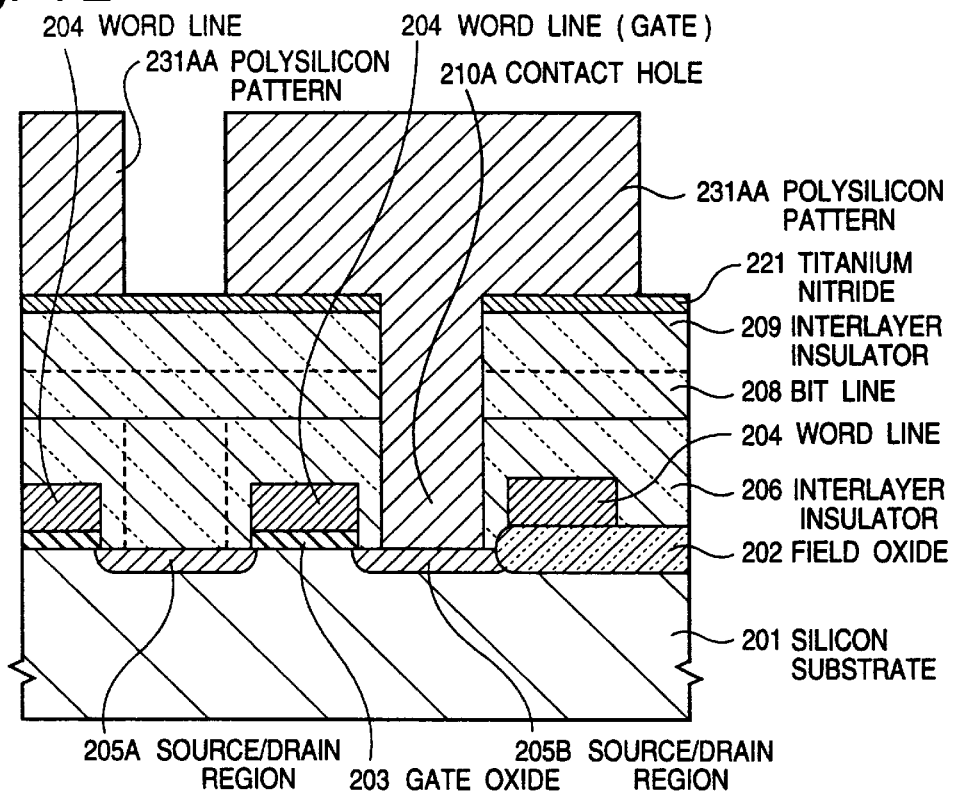

Succeedingly, a photoresist film pattern (not shown) is formed on a surface of the N⁺ polysilicon film 231A. A spacing between adjacent photoresist film unitary patterns (which spacing substantially corresponds to a spacing between adjacent storage node electrodes in a completed DRAM) is on the order of 0.35 μm. By using the photoresist film pattern as a mask, an anisotropic dry etching using HBr as an etching gas is conducted to the N⁺ polysilicon film 231A, so that a silicon film pattern 231AA composed of N⁺ polysilicon film is formed, as shown in FIG. 7E.

In the anisotropic dry etching using HBr as the etching gas, an etching rate of the titanium nitride film 221 is on the order of 1/50 of the etching rate of the N⁺ polysilicon film 231A, and therefore, the titanium nitride film 221 remains at a final stage of the formation process of the silicon film pattern 231AA. On the other hand, since the titanium nitride film 221 is a conductive film, a localization of the current path for the etching ions (and positive charges) is avoided. In this embodiment, therefore, no notch is generated in the silicon film pattern 231AA in the process of forming the silicon film pattern 231AA.

In the above mentioned step, the silicon film patterns 231AA are electrically interconnected to one another through the titanium nitride film 221. Therefore, it is necessary to remove the titanium nitride film 221 which is not directly covered with the silicon film patterns 231AA or to convert the same into an insulator film, with generating no notch. For this purpose, in this first embodiment, after the photoresist film pattern is removed, the substrate is put into a dry oxygen atmosphere under a temperature on the order of 500° C., so that the titanium nitride film 221, which is not directly covered with the silicon film patterns 231AA, is oxidized to form a titanium oxide film 222, as shown in FIGS. 9A and 9B. Thus, the silicon film patterns 231AA are electrically isolated from one another. In this stage, a storage node electrode 211A composed of the silicon film patterns 231AA and the remaining titanium nitride film 221A is formed.

Incidentally, prior to oxidation of the titanium nitride film 221, it is preferred to sputter the titanium nitride film 221 by argon before removing the photoresist film pattern. With this treatment, oxidation of the titanium nitride film 221 can be facilitated.

On the other hand, it is not preferred to use for example a titanium film in place of the titanium nitride film 221. The reason for this is as follows: If the titanium film is used, a titanium disilicide (TiSi₂) film is formed at the step of forming the N⁺ polysilicon film. In this connection, if an amorphous silicon film is used in place of the polysilicon film, a titanium monosilicide (TiSi) film is formed in the oxidation at the temperature on the order of 500° C. If these titanium silicide films are formed, it becomes difficult to selectively leave the titanium silicide film at the time of forming the silicon film pattern, and therefore, it becomes impossible to avoid generation of the notches. When the conductive film is converted into an insulative film as mentioned above, it is not preferred that a surface of the silicon film pattern 231AA is oxidized. If the titanium nitride film 221 is adopted as in the first embodiment, the titanium nitride film 221 can be oxidized at such a low temperature that the surface of the silicon film pattern 231AA is not substantially oxidized.

Succeedingly, a silicon nitride film (not shown) is formed on the whole surface by for example a LPCVD process, and then, a surface of the silicon nitride film is oxidized, so that, as shown in FIGS. 9A and 9B, there is formed a capacitor dielectric film 212 having a thickness of 5 nm translated into a silicon oxide film. Thereafter, a cell plate electrode 213 composed of an N⁺ polysilicon film film having the thickness of 150 nm, is formed to cover the capacitor dielectric film 212. Thus, a COB structure DRAM memory cell in accordance with the first embodiment is completed, as can be seen from FIGS. 8A and 8B and FIGS. 9A and 9B.

As seen from the above, according to the first embodiment of the present invention, it is possible to form the silicon film pattern (which constitutes the storage node electrode) with avoiding generation of the notches. Therefore, the storage node electrode having a stable mechanical strength can be obtained.

Now, a second embodiment of the process in accordance with the present invention for forming the COB structure DRAM memory cell will be described with reference to FIGS. 10A to 10D, which are are diagrammatic sectional views of a portion of a DRAM for illustrating the second embodiment of the process in accordance with the present invention for forming the COB structure DRAM memory cell. In FIGS. 10A to 10D, elements corresponding to those shown in FIGS. 7A to 7E and 9A and 9B are given the same Reference Numerals. The second embodiment is characterized in that a silicon film pattern which constitutes a storage node electrode is formed in such a condition that there exists no current path for etching ions and electric charges.

In this second embodiment, a process until the formation of the second interlayer insulator film 209 is the same as the corresponding process of the first embodiment, and therefore, explanation thereof will be omitted.

Figure 10A:
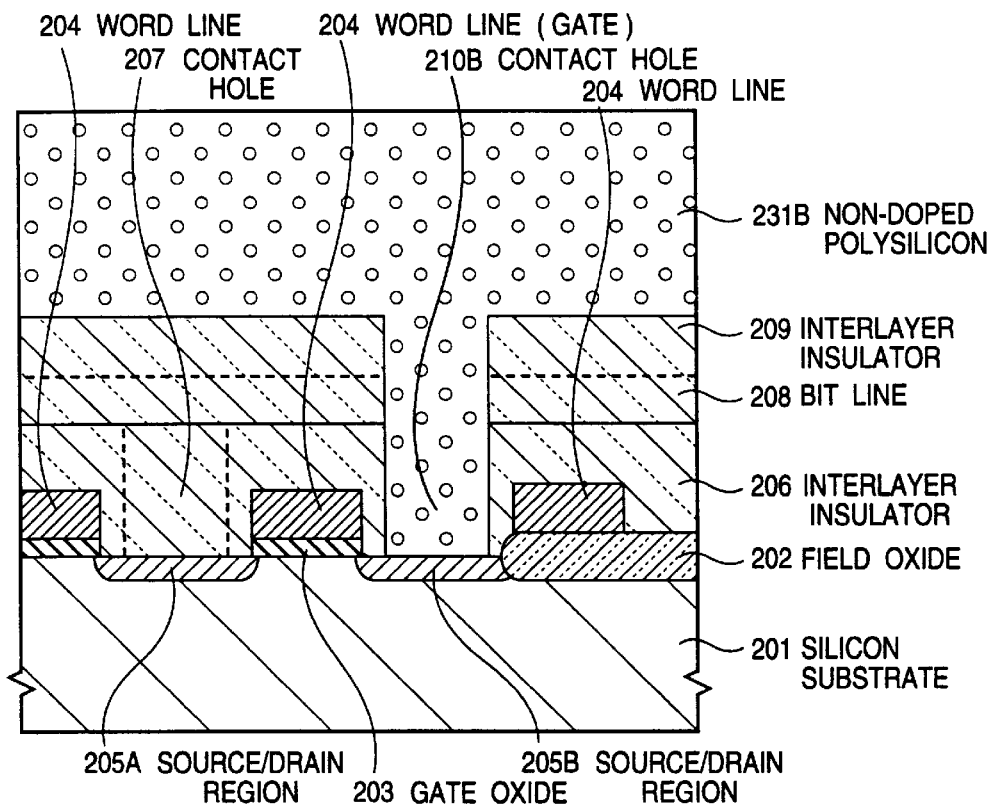
FIGS. 10A to 10D are diagrammatic sectional views of a portion of a DRAM for illustrating a second embodiment of the process in accordance with the present invention for forming the COB structure DRAM memory cell.

As shown in FIG. 10A, a node contact hole 210B is formed to penetrate through the interlayer insulator films 209 and 206 and reach the N⁺ source/drain diffused region 205B. A size (or diameter) of the node contact hole 210B is on the order of 0.35 μm Succeedingly, a non-doped polysilicon film 231B having the film thickness on the order of 0.6 μm is formed by a LPCVD process under a film deposition temperature of 650° C., as shown in FIG. 10A. In this second embodiment, alternatively, a non-doped amorphous silicon film can be formed in place of the non-doped polysilicon film 231B.

Figure 10B:
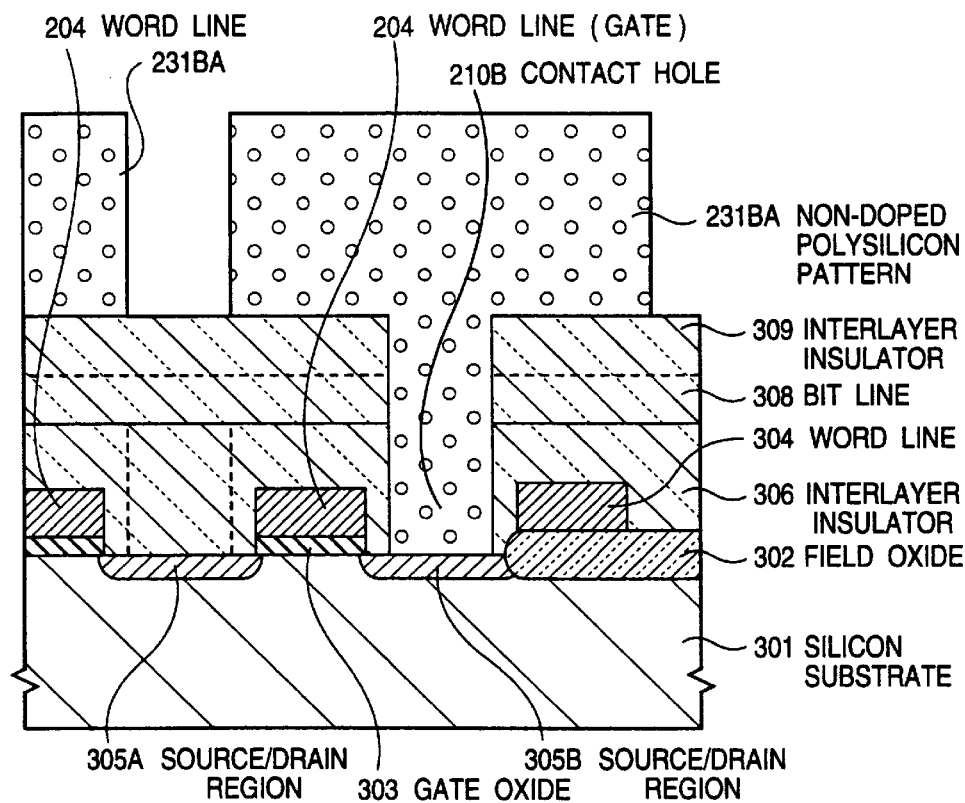

Thereafter, a photoresist film pattern (not shown) is formed on a surface of the non-doped polysilicon film 231B. A spacing between adjacent photoresist film unitary patterns is on the order of 0.35 μm. By using the photoresist film pattern as a mask, an anisotropic dry etching is conducted to the non-doped polysilicon film 231B, so that a silicon film pattern 231BA composed of non-doped polysilicon film is formed, as shown in FIG. 10B. As already mentioned in connection with the second experimental example, no notch is generated in the silicon film pattern 231BA.

Figure 10C:
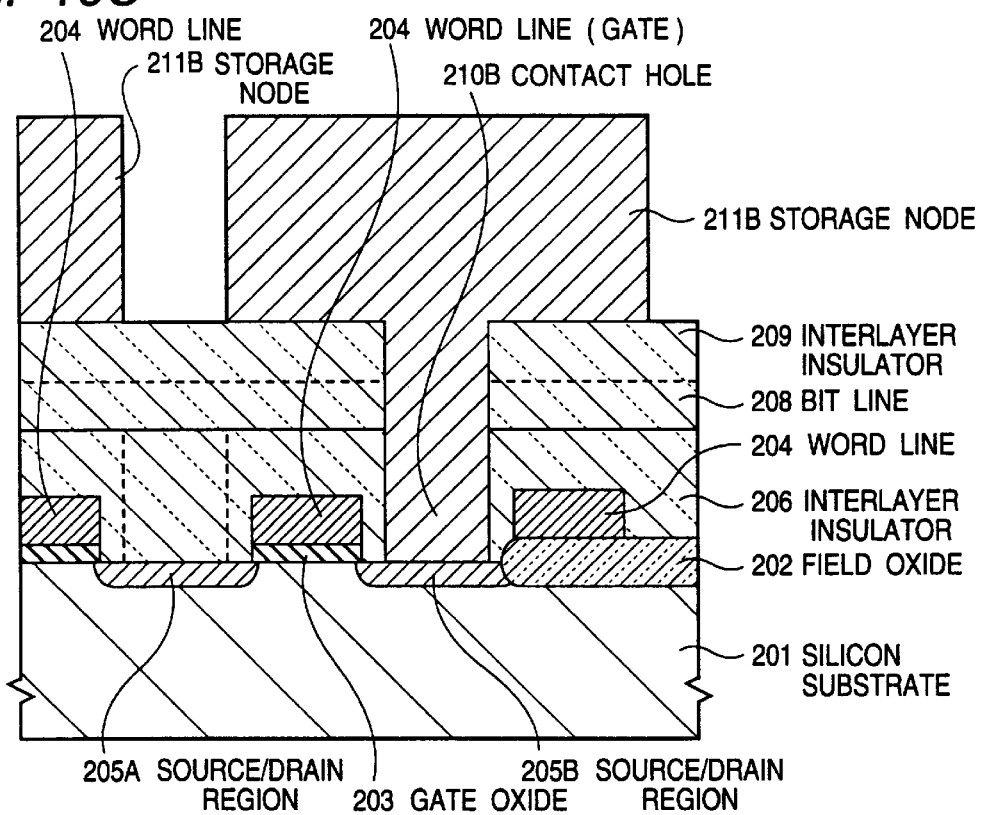

After the photoresist film pattern is removed, impurity is thermally diffused or ion-implanted into the silicon film pattern 231BA composed of non-doped polysilicon film, so that the silicon film pattern 231BA composed of non-doped polysilicon film is converted into an N+ polysilicon film. Thus, a storage node electrode 211B composed of N+ polysilicon film is formed as shown in FIG. 10C.

Figure 10D:
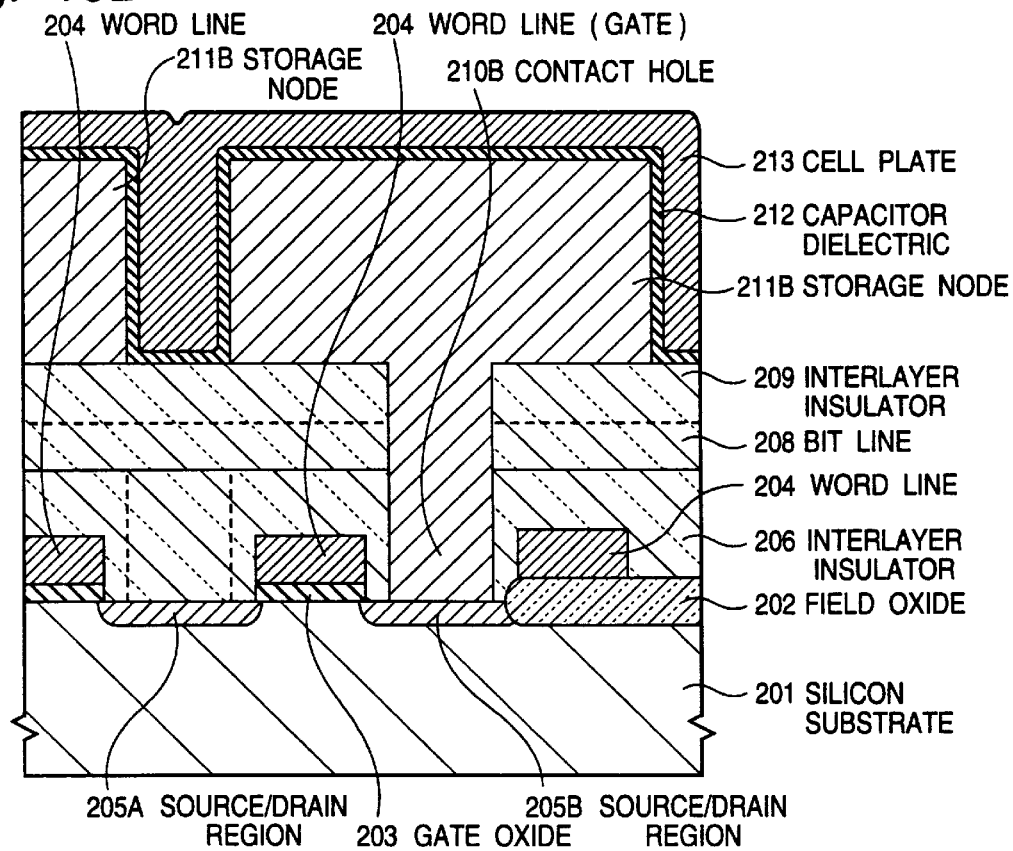

Thereafter, similarly to the first embodiment, a capacitor dielectric film 212 and a cell plate electrode 213 are formed as shown in FIG. 10D, so that the DRAM in accordance with the second embodiment of the present invention is completed.

As seen from the above, according to the second embodiment of the present invention, it is possible to form the silicon film pattern (which constitutes the storage node electrode) with avoiding generation of the notches, similarly to the first embodiment. Therefore, the second embodiment can exert an advantage similar to that obtained in the first embodiment.

Also as seen form the above, in the process of the anisotropic dry etching for forming the silicon film pattern (which constitutes the storage node electrode), the first embodiment is characterized by avoiding a local concentration of the current path for etching ions and electric charges, although the current path exists, and the second embodiment is characterized by removing or eliminating the current path for etching ions and electric charges. A third embodiment, which will be described hereinafter, is characterized by increasing the resistance of the current path for etching ions and electric charges, for the purpose of preventing or minimizing generation of the notches.

Figure 11A:
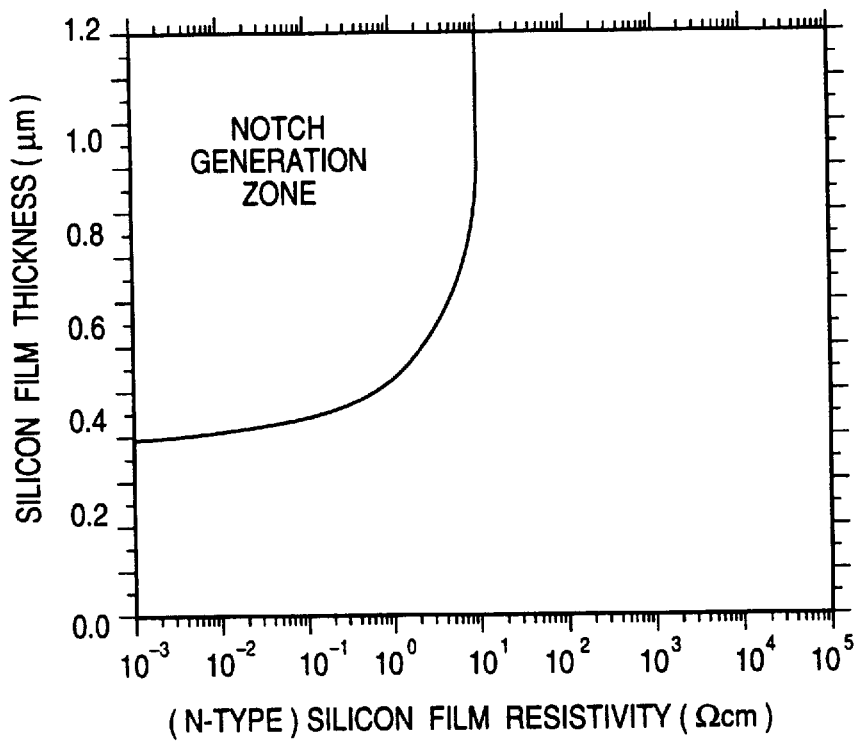
FIG. 11A is a graph showing a relation between generation of the notch and a silicon film resistivity and a silicon film thickness, for the purpose of illustrating a third embodiment of the process in accordance with the present invention for forming the COB structure DRAM memory cell.
Figure 11B:
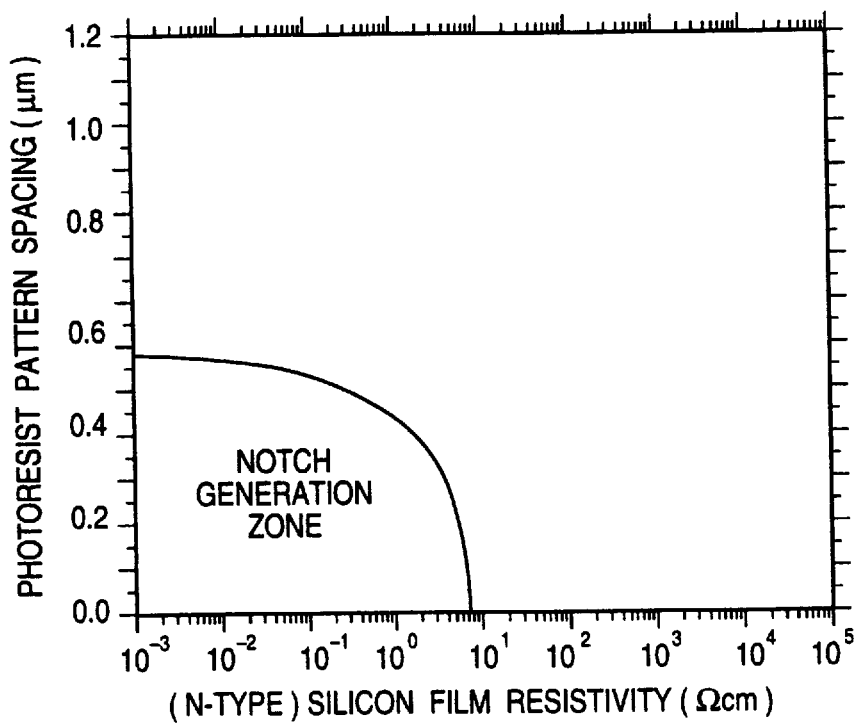
FIG. 11B is a graph showing a relation between generation of the notch and a silicon film resistivity and a photoresist film pattern spacing, for the purpose of illustrating the third embodiment of the process in accordance with the present invention for forming the COB structure DRAM memory cell.
Figure 12:
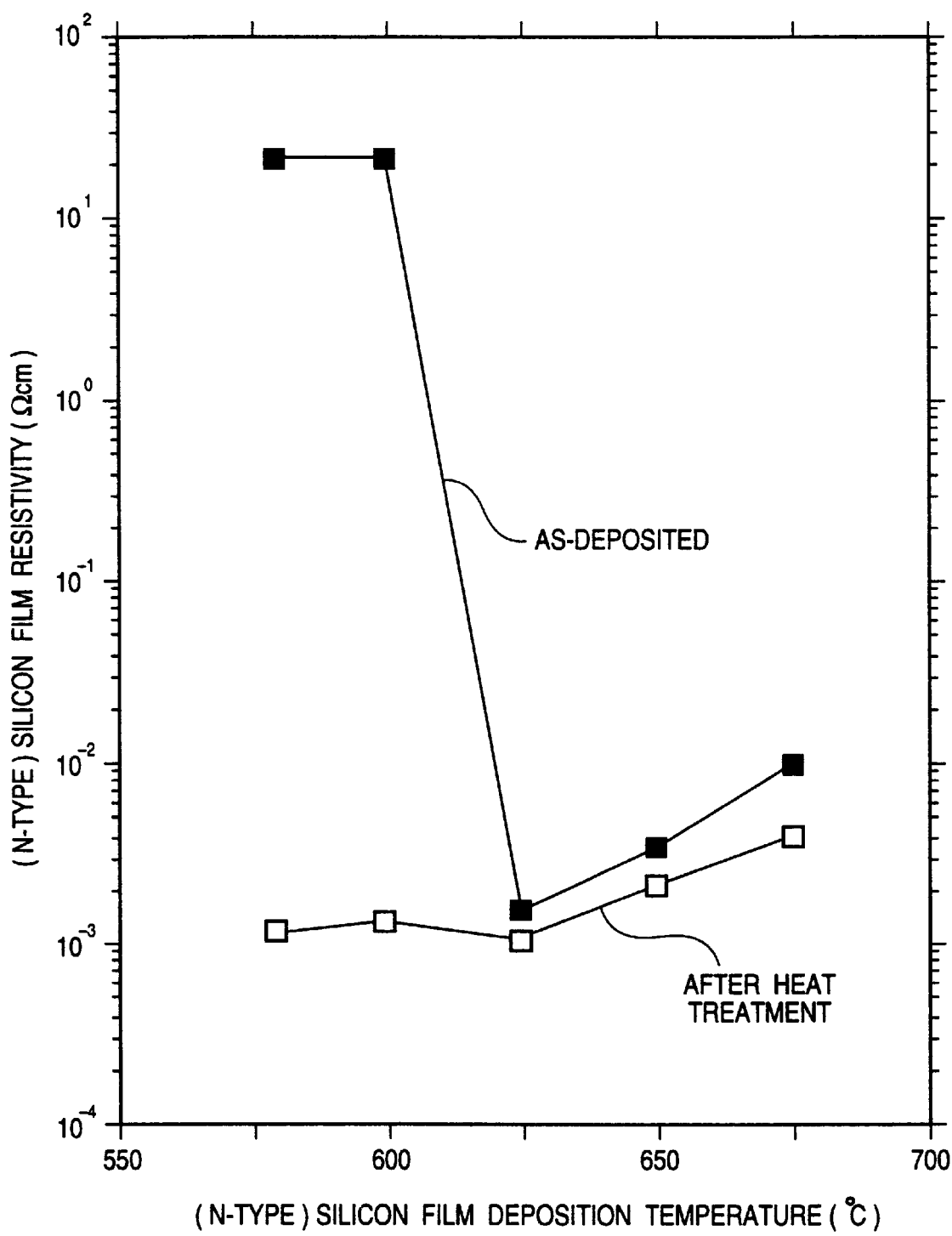
FIG. 12 is a graph showing a relation between resistivity of an as-deposited silicon film and resistivity of a heat-treated silicon film, for the purpose of illustrating the third embodiment of the process in accordance with the present invention for forming the COB structure DRAM memory cell.

The inventor made an experiment and measurement to know whether or not notches are generated while changing the resistivity value of the silicon film, the thickness of the silicon film and the spacing or gap between adjacent silicon film patterns. FIG. 11A is a graph showing a relation between the silicon film resistivity and the silicon film thickness generating the notches, and FIG. 11B is a graph showing a relation between the silicon film resistivity and the silicon film pattern spacing generating the notches. Here, the silicon film pattern spacing is actually represented by a spacing between adjacent photoresist patterns in a photoresist mask pattern, and corresponds to a spacing between adjacent storage node electrodes in a completed DRAM. FIG. 12 is a graph showing a relation between resistivity of an as-deposited N or N+ silicon film and resistivity of a heat-treated silicon film.

It could be seen from FIGS. 11A and 11B that, if the silicon film thickness is not greater than 0.4 $\mu$m, or if the silicon film pattern spacing is not less than 0.6 $\mu$m, no notch is generated, regardless of the resistivity of the silicon film. In addition, if the resistivity of the silicon film is not less than 10 $\Omega$cm, no notch is generated, regardless of the silicon film thickness and regardless of the silicon film pattern spacing. This result is considered to have a relation to the degree of coverage of the reaction product deposited to the side surface of the silicon film pattern in the process of the anisotropic dry etching.

If it is not hesitated to elongate the manufacturing process, it may be considered to form a silicon film pattern by patterning an N-type polysilicon film meeting with the above mentioned conditions, and then to perform a thermal diffusion or ion implantation for converting the silicon film pattern into an N+ silicon film pattern. However, if this procedure is adopted, the process becomes more complicated than the second embodiment. In order to make the third embodiment simpler than the second embodiment, it is preferable that an impurity introducing step for converting the silicon film pattern into the N+ silicon film pattern after the silicon film pattern is formed, becomes unnecessary.

In the third embodiment, therefore, the inventor adopts a method of patterning a high-resistance N-type amorphous silicon containing a high concentration of impurity, and then, of conducting a heat treatment. As mentioned above, FIG. 12 is a graph showing a relation between the resistivity of an as-deposited N or N+ silicon film and the resistivity of a heat-treated silicon film. Here, the film deposition temperature was changed under the condition that the pressure is 1×10$^4$ Pa, the flow rate of phosphine (PH$_3$) is 0.45 sccm and the flow rate of monosilane (SiH$_4$) is 150 sccm. The heat treatment for converting into N+ was conducted at a temperature of 850° C. for ten minutes. Under this film deposition condition, the deposition temperature is preferred to be not higher than 600° C. in order to obtain a silicon film having the resistivity of not less than 10 $\Omega$cm. In this case, the as-deposited film is an N-type amorphous silicon film, and becomes an N+ polysilicon film after a heat treatment.

Now, the third embodiment will be described with reference to FIGS. 13A to 13D, which are diagrammatic sectional views of a portion of a DRAM for illustrating the third embodiment of the process in accordance with the present invention for forming the COB structure DRAM memory cell. In FIGS. 13A to 13D, elements corresponding to those shown in FIGS. 7A to 7E, 9A and. 9B, and 10A to 10D are given the same Reference Numerals.

In this third embodiment, a process until a node contact hole 210C is formed to penetrate through the interlayer insulator films 209 and 206 and to reach the N+ source/drain diffused region 205B, is the same as the corresponding process of the second embodiment, and therefore, explanation thereof will be omitted. A size (or diameter) of the node contact hole 210C is on the order of 0.35 $\mu$m.

Figure 13A:
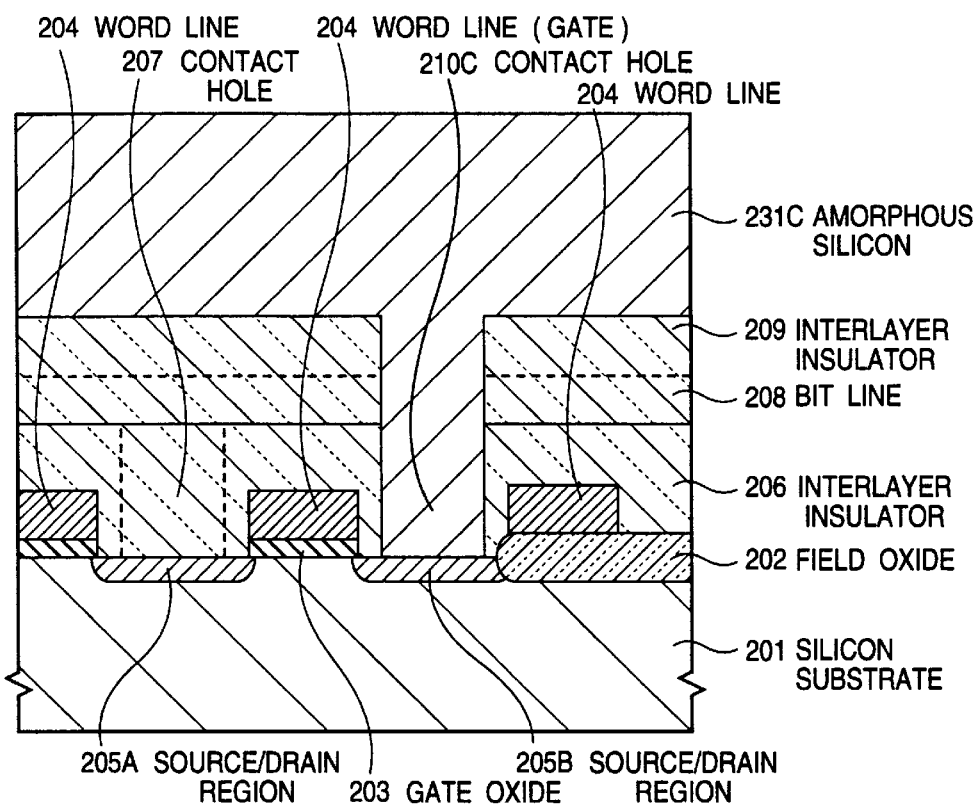
FIGS. 13A to 13D are diagrammatic sectional views of a portion of a DRAM for illustrating the third embodiment of the process in accordance with the present invention for forming the COB structure DRAM memory cell.

Succeedingly, as shown in FIG. 13A, an N-type amorphous silicon film 231C having the film thickness on the order of 0.6 $\mu$m is formed by a LPCVD process under the condition that the pressure is 1×10$^4$ Pa, the flow rate of phosphine (PH$_3$) is 0.45 sccm, the flow rate of monosilane (SiH$_4$) is 150 sccm, and the film deposition temperature is 580° C. The N-type amorphous silicon film 231C thus formed has the resistivity on the order of 20 $\Omega$cm.

Figure 13B:
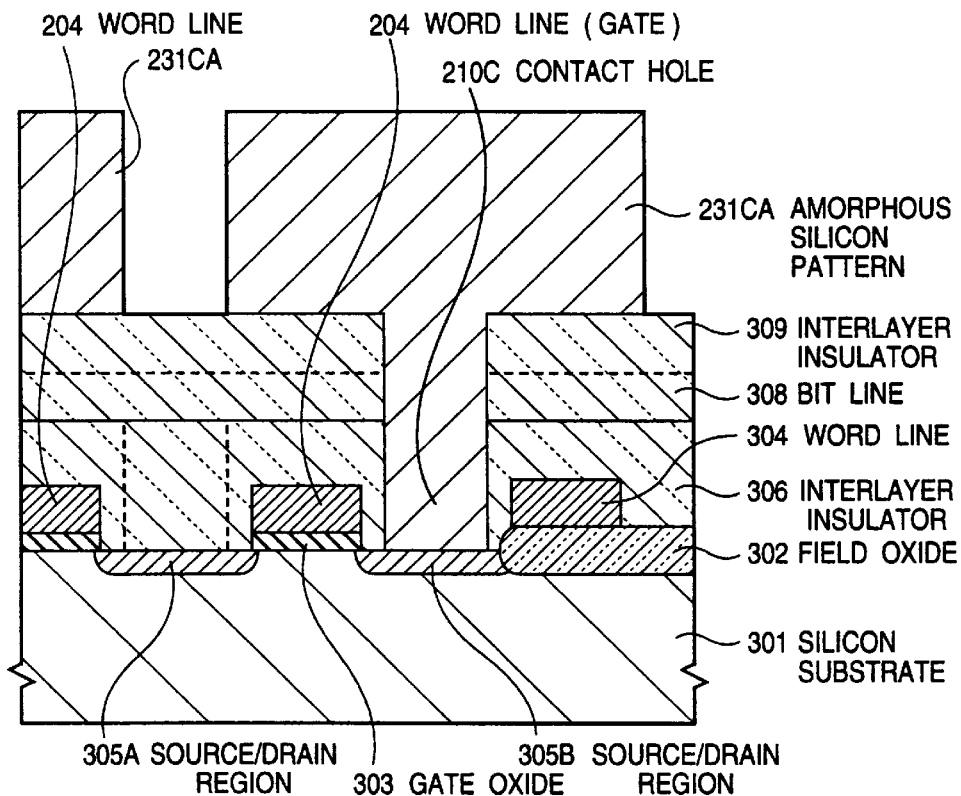

Succeedingly, a photoresist film pattern (not shown) is formed on a surface of the N-type amorphous silicon film 231C. A spacing between adjacent photoresist film unitary patterns is on the order of 0.35 $\mu$m. By using the photoresist film pattern as a mask, an anisotropic dry etching is conducted to the N-type amorphous silicon film 231C, so that a silicon film pattern 231CA composed of N-type amorphous silicon film is formed, as shown in FIG. 13B. In this patterning process, no notch is generated in the silicon film pattern 231CA.

Figure 13C:
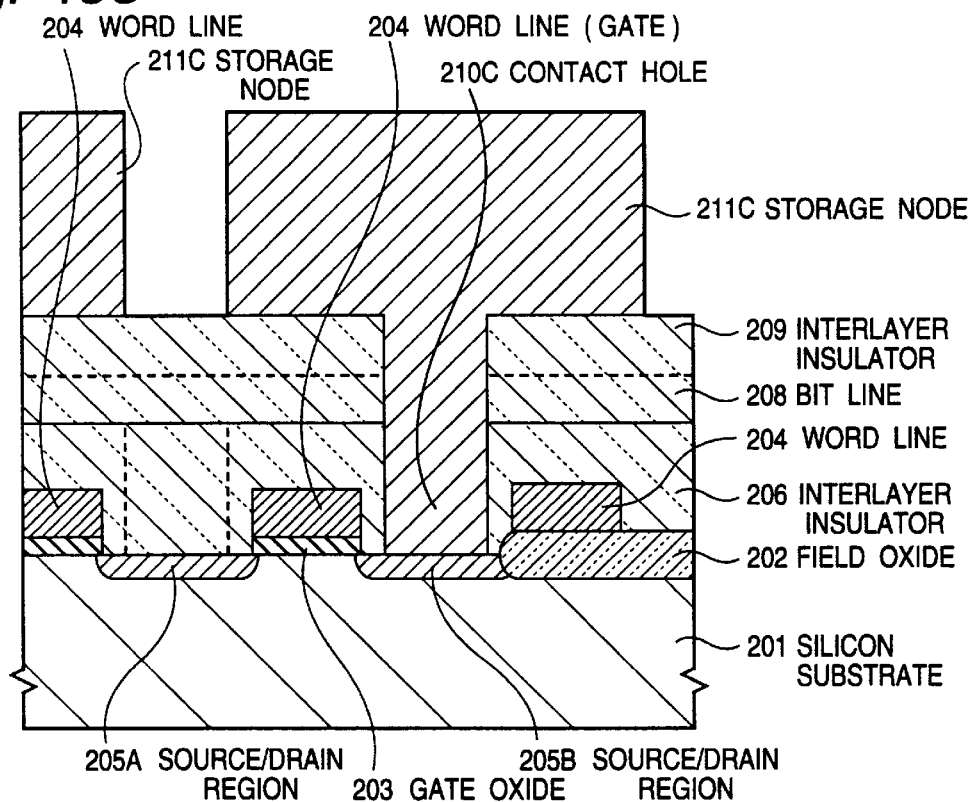

After the photoresist film pattern is removed, the heat treatment is conducted under the above mentioned condition, so that the silicon film pattern 231CA composed of the N-type amorphous silicon film is converted into an N+ polysilicon film. Thus, a storage node electrode 211C composed of N+ polysilicon film is formed as shown in FIG. 13C.

Figure 13D:
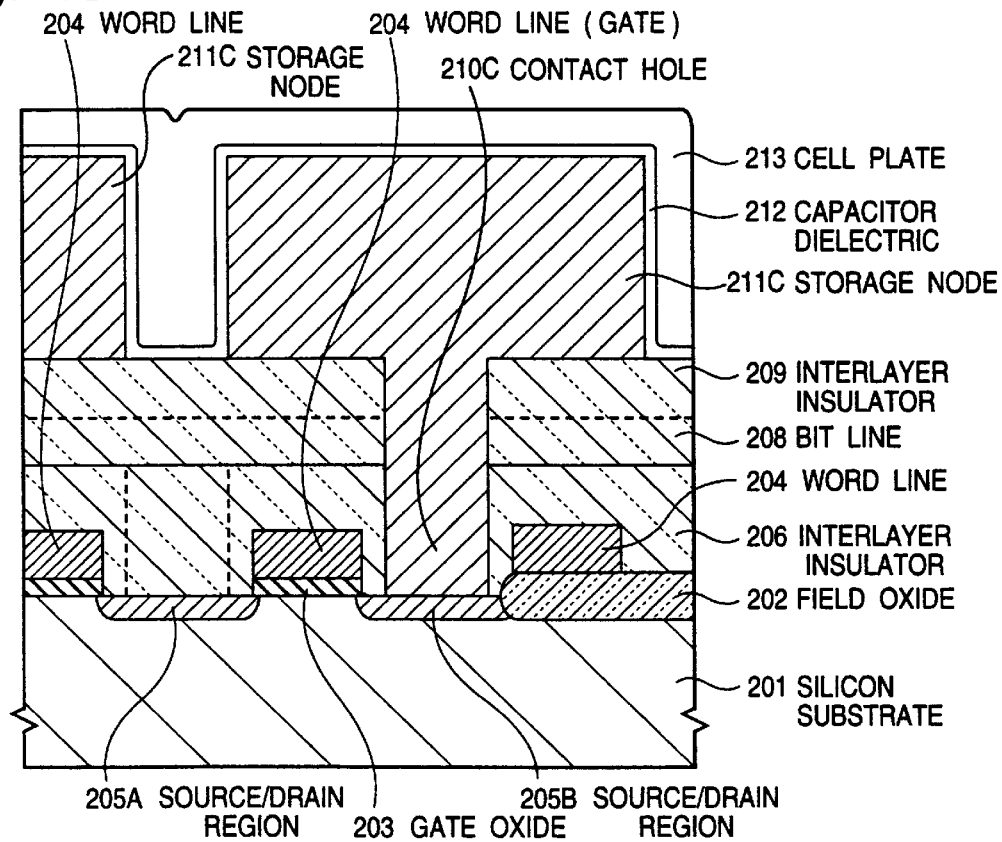

Thereafter, similarly to the first embodiment, a capacitor dielectric film 212 and a cell plate electrode 213 are formed as shown in FIG. 13D, so that the DRAM in accordance with the third embodiment of the present invention is completed.

The third embodiment has the advantage obtained in the first and second embodiments, and in addition, is simpler in process than the first and second embodiments.

As seen form the above, according to the method in accordance with the present invention for manufacturing the COB structure DRAM memory cell, in the process of the anisotropic dry etching for forming the silicon film pattern (which constitutes the COB structure storage node electrode), generation of the notches in the silicon film pattern can be prevented or minimized, by removing or eliminating the current path for etching ions and electric charges, or although the current path exists, by avoiding a local concentration of the current path for etching ions and electric charges, or by increasing the resistance of the current path for etching ions and electric charges. Accordingly, it is possible to obtain the storage node electrode having a stable mechanical strength.

The invention has thus been shown and described with reference to the specific embodiments. However, it should be noted that the present invention is in no way limited to the details of the illustrated structures but changes and modifications may be made within the scope of the appended claims.

What is claimed is:

1. A method for manufacturing a semiconductor memory, comprising steps of:

selectively forming a field insulator film on a surface of a P-type silicon substrate to confine a device formation region, forming a gate insulator film on said surface of said silicon substrate within said device formation region, forming on said gate insulator film a word line functioning as a gate electrode, and forming within said device formation region at least one pair of $N^+$ source/drain regions in self alignment with said word line;

forming a first interlayer insulator film to cover the surface of said silicon substrate, said field insulator film and said word line, forming a bit contact hole to penetrate through said first interlayer insulator film reaching to one of said at least one pair of $N^+$ source/drain regions, and forming a bit line to extend over said first interlayer insulator film and to fill said bit contact hole so that said bit line is electrically connected to said one of said at least one pair of $N^+$ source/drain regions;

forming a second interlayer insulator film to cover the surface of said first interlayer insulator and said bit line, forming a titanium nitride film to cover a surface of said second interlayer insulator, forming a node contact hole to penetrate through said titanium nitride film and said second and first interlayer insulator films reaching to the other of said at least one pair of $N^+$ source/drain regions;

forming an $N^+$ polysilicon film to cover a surface of said titanium nitride film and to fill said node contact hole, selectively forming a photoresist film pattern on said $N^+$ polysilicon film, and conducting an anisotropic dry etching to said $N^+$ polysilicon film using said photoresist film pattern as a mask, so as to form a silicon film pattern of said $N^+$ polysilicon film;

converting an exposed titanium nitride film into a titanium oxide film, so that a storage node electrode is formed of said silicon film pattern and said titanium nitride film remaining under said silicon film pattern, and is electrically connected to the other of said at least one pair of $N^+$ source/drain regions; and forming a capacitor dielectric film to cover said storage node electrode, and forming a cell plate electrode to cover said capacitor dielectric film.

2. A method claimed in claim 1 wherein said exposed titanium nitride film is converted into said titanium oxide film, by sputtering said exposed titanium nitride film with argon, and then, by oxidizing said exposed titanium nitride film by a low temperature oxidation in a dry oxygen atmosphere.

3. A method of manufacturing a semiconductor memory, comprising steps of:

a) selectively forming a field insulator film on a surface of a silicon substrate of a first conductivity-type to confine a device formation region, forming a gate insulator film on said surface of said silicon substrate within said device formation region, forming on said gate insulator film a word line functioning as a gate electrode, and forming within said device formation region at least one pair of source/drain regions of a second conductivity-type opposite to said first conductivity-type, in self alignment with said word line;

b) forming a first interlayer insulator film to cover the surface of said silicon substrate, said field insulator film and said word line, forming a bit contact hole to penetrate through said first interlayer insulator film reaching to one of said at least one pair of source/drain regions, and forming a bit line to extend over said first interlayer insulator film and to fill said bit contact hole so that said bit line is electrically connected to said one of said at least one pair of source/drain regions;

c) forming a second interlayer insulator film to cover the surface of said first interlayer insulator and said bit line, forming a node contact hole to penetrate through said second and first interlayer insulator films reaching to the other of said at least one pair of source/drain regions;

d) forming by a method including an anisotropic dry etching step a patterned storage node electrode of highly conductive polysilicon electrically connected to the other of said at least one pair of source/drain regions; and e) forming a capacitor dielectric film to cover said storage node electrode, and forming a cell plate electrode to cover said capacitor dielectric film, wherein the step d) includes impeding the formation of a notch in the storage node electrode adjacent the interlayer insulator film by preventing establishment of a concentrated local current path for etching ions through a structure which is to form the storage node electrode.

4. The method as claimed in claim 3, wherein the establishment of the concentrated local current path is prevented by at least one of removing, impeding and by-passing said path.

* * * * *